(12) United States Patent
Son et al.

(10) Patent No.: US 10,235,258 B2
(45) Date of Patent: Mar. 19, 2019

(54) MEMORY DEVICE CAPABLE OF QUICKLY REPAIRING FAIL CELL

(71) Applicants: Jong-pil Son, Seongnam-si (KR); Chul-woo Park, Yongin-si (KR); Su-a Kim, Seongnam-si (KR)

(72) Inventors: Jong-pil Son, Seongnam-si (KR); Chul-woo Park, Yongin-si (KR); Su-a Kim, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 688 days.

(21) Appl. No.: 14/683,705

(22) Filed: Apr. 10, 2015

(65) Prior Publication Data

US 2016/0077940 A1 Mar. 17, 2016

(30) Foreign Application Priority Data

Sep. 12, 2014 (KR) ........................ 10-2014-0121271

(51) Int. Cl.
*G06F 11/20* (2006.01)
*G11C 29/42* (2006.01)
(Continued)

(52) U.S. Cl.
CPC ...... *G06F 11/2094* (2013.01); *G06F 11/1048* (2013.01); *G11C 29/42* (2013.01);
(Continued)

(58) Field of Classification Search
CPC ............. G06F 11/2094; G06F 11/1048; G06F 2201/85; G11C 29/42; G11C 29/4401;
(Continued)

(56) References Cited

U.S. PATENT DOCUMENTS 6,055,196 A * 4/2000 Takai ................... G11C 29/808
365/200
6,097,643 A * 8/2000 Hasegawa .............. G11C 29/72
365/200

(Continued)

FOREIGN PATENT DOCUMENTS

JP 2008-217926 A 9/2008
KR 10-2015-0028118 3/2015

*Primary Examiner* — April Y Blair
*Assistant Examiner* — Dipakkumar B Gandhi
(74) *Attorney, Agent, or Firm* — Harness, Dickey & Pierce, P.L.C.

(57) ABSTRACT

The memory device includes a memory array, control logic and a recovery circuit. The memory array has a first region configured to store data, a second region configured to store a portion of fail cell information, and a third region configured to store recovery information. The fail cell information identifies failed cells in the first region, and the recovery information is for recovering data stored in the identified failed cells. The control logic is configured to store the fail cell information, to transfer the portion of the fail cell information to the second region of the memory array, and to determine whether to perform a recovery operation based on address information in an access request and the portion of the fail cell information stored in the second region. The access request is a request to access the first region. The recovery circuit is configured to perform the recovery operation.

36 Claims, 24 Drawing Sheets

(51) Int. Cl.
   *G11C 29/44* (2006.01)
   *G11C 29/00* (2006.01)
   *G06F 11/10* (2006.01)
   *G11C 29/04* (2006.01)

(52) U.S. Cl.
   CPC .......... *G11C 29/4401* (2013.01); *G11C 29/70* (2013.01); *G06F 2201/85* (2013.01); *G11C 2029/0409* (2013.01); *G11C 2029/4402* (2013.01)

(58) Field of Classification Search
   CPC ............ G11C 29/70; G11C 2029/0409; G11C 2029/4402
   See application file for complete search history.

(56) References Cited

U.S. PATENT DOCUMENTS

| | | | |
|---|---|---|---|
| 6,172,918 B1 * | 1/2001 | Hidaka | G11C 7/1012 365/189.05 |
| 6,178,127 B1 * | 1/2001 | Haraguchi | G11C 29/808 365/200 |
| 6,205,063 B1 | 3/2001 | Aipperspach et al. | |
| 6,421,789 B1 * | 7/2002 | Ooishi | G11C 29/14 365/201 |
| 6,442,084 B2 | 8/2002 | Keeth | |
| 6,763,480 B2 * | 7/2004 | Harari | G06F 3/0601 365/185.09 |
| 6,819,608 B2 | 11/2004 | Watanabe | |
| 7,028,234 B2 | 4/2006 | Huckaby et al. | |
| 7,237,175 B2 | 6/2007 | Hatakenaka et al. | |
| 7,266,759 B2 | 9/2007 | Koga et al. | |
| 7,366,971 B2 | 4/2008 | Kikutake et al. | |
| 7,458,004 B2 | 11/2008 | Takahashi | |
| 7,603,592 B2 | 10/2009 | Sekiguchi et al. | |
| 7,861,138 B2 | 12/2010 | Oh | |
| 8,001,450 B2 | 8/2011 | Onishi et al. | |
| 8,151,173 B2 | 4/2012 | Hirose et al. | |
| 8,156,402 B2 | 4/2012 | Kohler et al. | |
| 8,286,054 B2 | 10/2012 | Kawabata | |
| 2003/0086306 A1 * | 5/2003 | Takahashi | G06F 11/1008 365/200 |
| 2006/0064618 A1 * | 3/2006 | Wu | G11C 29/16 714/733 |
| 2007/0038919 A1 * | 2/2007 | Sekiguchi | G06F 11/1044 714/763 |
| 2007/0136640 A1 * | 6/2007 | Jarrar | G11C 11/005 714/763 |
| 2007/0189088 A1 * | 8/2007 | Kohara | G11C 29/24 365/201 |
| 2009/0089646 A1 * | 4/2009 | Hirose | G06F 11/1048 714/766 |
| 2012/0060056 A1 * | 3/2012 | Lee | G06F 11/1048 714/15 |
| 2012/0317352 A1 | 12/2012 | Kang et al. | |
| 2014/0013183 A1 | 1/2014 | Sohn et al. | |
| 2014/0026018 A1 * | 1/2014 | Yang | G06F 11/1068 714/773 |
| 2015/0287480 A1 * | 10/2015 | Wilson | G11C 29/70 365/96 |

* cited by examiner

FIG. 3B

| | T0 | T1 | T2 | T3 | T4 | T5 | T6 | T7 |
|---|---|---|---|---|---|---|---|---|
| DQ0 | Data0 | Data1 | Data2 | Data3 | Data4 | Data5 | Data6 | Data7 |
| DQ1 | Data8 | Data9 | Data10 | Data11 | Data12 | Data13 | Data14 | Data15 |
| DQ2 | Data16 | Data17 | Data18 | Data19 | Data20 | Data21 | Data22 | Data23 |
| DQ3 | Data24 | Data25 | Data26 | Data27 | Data28 | Data29 | Data30 | Data31 |
| DQ4 | Data32 | Data33 | Data34 | Data35 | Data36 | Data37 | Data38 | Data39 |
| DQ5 | Data40 | Data41 | Data42 | Data43 | Data44 | Data45 | Data46 | Data47 |
| DQ6 | Data48 | Data49 | Data50 | Data51 | Data52 | Data53 | Data54 | Data55 |
| DQ7 | Data56 | Data57 | Data58 | Data59 | Data60 | Data61 | Data62 | Data63 |
| ECCP | ECCP0[0:3] | ECCP1[0:3] | ECCP2[0:3] | ECCP3[0:3] | | | | |

FIG. 3C

|      | T0         | T1     | T2         | T3     | T4         | T5     | T6         | T7     |
|------|------------|--------|------------|--------|------------|--------|------------|--------|
| DQ0  | Data0      | Data1  | Data2      | Data3  | Data4      | Data5  | Data6      | Data7  |
| DQ1  | Data8      | Data9  | Data10     | Data11 | Data12     | Data13 | Data14     | Data15 |
| DQ2  | Data16     | Data17 | Data18     | Data19 | Data20     | Data21 | Data22     | Data23 |
| DQ3  | Data24     | Data25 | Data26     | Data27 | Data28     | Data29 | Data30     | Data31 |
| DQ4  | Data32     | Data33 | Data34     | Data35 | Data36     | Data37 | Data38     | Data39 |
| DQ5  | Data40     | Data41 | Data42     | Data43 | Data44     | Data45 | Data46     | Data47 |
| DQ6  | Data48     | Data49 | Data50     | Data51 | Data52     | Data53 | Data54     | Data55 |
| DQ7  | Data56     | Data57 | Data58     | Data59 | Data60     | Data61 | Data62     | Data63 |
| ECCP | ECCP0[0:3] |        | ECCP2[0:3] |        | ECCP4[0:3] |        | ECCP6[0:3] |        |

| FRA[0:m] | FCA[0:n] | ORDER | F | S |
|---|---|---|---|---|
| 0001100 | 00111010 | 00 | 1 | 1 |
| 0001101 | 00111011 | 01 | 1 | 1 |
| 0101101 | 10010011 | 10 | 1 | 0 |
| 1001101 | 11110011 | 11 | 1 | 1 |
| 1001100 | 10110011 | 10 | 1 | 1 |
| ⋮ | ⋮ | ⋮ | ⋮ | ⋮ |
| 1101100 | 10110111 | 01 | 1 | 0 |
| 1101111 | 10010011 | 11 | 1 | 1 |

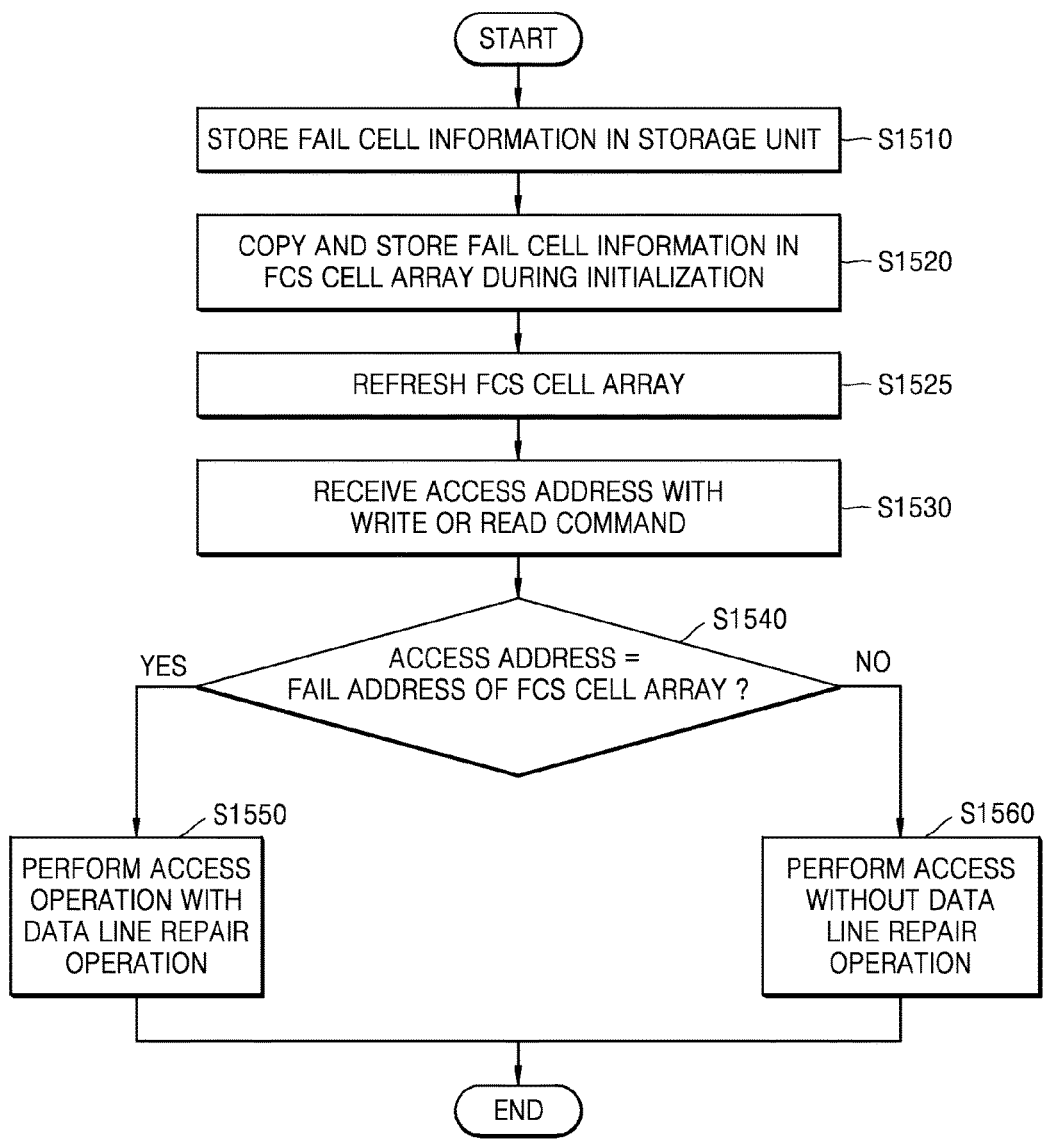

MEMORY DEVICE CAPABLE OF QUICKLY REPAIRING FAIL CELL

CROSS-REFERENCE TO RELATED APPLICATION

This application claims the benefit of Korean Patent Application No. 10-2014-0121271, filed on Sep. 12, 2014, in the Korean Intellectual Property Office, the disclosure of which is incorporated herein in its entirety by reference.

BACKGROUND

The inventive concepts relate to a semiconductor memory device, and more particularly, to a memory device and a memory system capable of quickly repairing a fail cell by copying and storing fail cell information in a memory cell.

A memory capacity of memory devices is increasing with the development of manufacturing process technologies. However, progress with respect to microfabrication process technology has resulted in an increase in the number of "fail" memory cells. If the number of fail cells increases, not only it is difficult to guarantee a memory capacity, but also memory device production yield decreases. In order to increase the memory device yield, information about a fail cell may be stored in a nonvolatile memory device, such as an anti-fuse, and a fail cell may be repaired by using the fail cell information stored in the anti-fuse. However, it takes a long time to read the fail cell information from the anti-fuse. Thus, an operation delay of the memory device occurs while repairing the fail cell. Accordingly, a method of reducing a delay that occurs while repairing a fail cell is desired.

SUMMARY

At least one embodiment relates to a memory device.

In one embodiment, the memory device includes a memory array, control logic and a recovery circuit. The memory array has a first region configured to store data, a second region configured to store a portion of fail cell information, and a third region configured to store recovery information. The fail cell information identifies failed cells in the first region, and the recovery information is for recovering data stored in the identified failed cells. The control logic is configured to store the fail cell information, to transfer the portion of the fail cell information to the second region of the memory array, and to determine whether to perform a recovery operation based on address information in an access request and the portion of the fail cell information stored in the second region. The access request is a request to access the first region. The recovery circuit is configured to perform a recovery operation if the control logic determines to perform the recovery operation.

In one embodiment, the control logic is configured to transfer only fail cell column address information in the fail cell information as the portion of the fail cell information to the second region. The fail cell column address information indicates column addresses of the identified failed cells.

In one embodiment, the control logic is configured to access the fail cell column address information from the second region using a row address in the address information in the access request.

In one embodiment, the fail cell column address information further includes flag information, and the flag information indicates whether the row address accesses one of the identified failed cells.

In one embodiment, the fail cell column address information further includes order information, and the order information indicates which data associated with the column addresses is associated with the identified failed cells.

In one embodiment, the fail cell column address information further includes flag information, and the flag information indicates whether the fail cell column address information is valid.

In one embodiment, the fail cell column address information further includes parity information, and the parity information is for correcting errors in the fail cell column address information.

In one embodiment, the fail cell column address information further includes recovery mode information respectively indicating which one of at least two recovery operations to perform for each of the column addresses.

In one embodiment, the second region is divided into a plurality of blocks, and the control logic is configured to transfer the fail cell column address information to the second region such that at least two of the plurality of blocks collectively store the fail cell column address information for one of the identified failed cells.

In one embodiment, the first region is divided into a plurality of first blocks; the second region is divided into a plurality of second blocks; and each of the plurality of second blocks shares a data line with a respective one of the plurality of first blocks.

In one embodiment, the access request is a write request, the recovery circuit is configured to obtain the recovery information based on data to be written if the control logic determines to perform the recovery operation, and the memory device is configured to store the recovery information in the third region as part of the recovery operation.

In one embodiment, the recovery operation is an error correction operation and the recovery information includes parity bits.

In one embodiment, the recovery operation is a data replacement operation and the recovery information includes data to use as a replacement for the data in the identified failed cells.

In one embodiment, the access request is a read request, the memory device is configured to read the recovery information if the control logic determines to perform the recovery operation, and the recovery circuit is configured to perform the recovery operation based on the read recovery information.

In one embodiment, the recovery operation is an error correction operation and the recovery information includes parity bits.

In one embodiment, the recovery circuit includes an error correction coding circuit configured to error correct code data output at a same time across a plurality of data lines.

In one embodiment, the recovery operation is a data replacement operation and the recovery information includes data to use as a replacement for the data in the identified failed cells.

In one embodiment, the recovery circuit is configured to perform an error correction operation as the recovery operation such that the recovery information includes parity bits, and the recovery circuit is configured to perform a data replacement operation as the recovery operation such that the recovery information includes data to use as a replacement for the data in the failed cell. The control logic is configured to control the recovery circuit to perform one of the error correction operation and the data replacement operation as the recovery operation for each of the column addresses based on mode information associated with each of the column addresses.

In another embodiment, the memory device includes a memory array and a control logic configured to store fail cell information, the fail cell information identifying failed cells in the memory array. The control logic is configured to transfer only fail cell column address information in the fail cell information to the memory array. The fail cell column address information indicates column addresses of the identified failed cells. The control logic is configured to determine whether to perform a recovery operation based on address information in an access request and the fail cell column address information stored in the memory array, and the access request is a request to access the memory array. A recovery circuit is configured to perform the recovery operation if the control logic determines to perform the recovery operation.

In one embodiment, the control logic is configured to access the fail cell column address information from the memory array using a row address in the address information in the access request.

In one embodiment, the fail cell column address information further includes flag information, the flag information indicating whether the row address accesses one of the identified failed cells.

In one embodiment, the fail cell column address information further includes order information, and the order information indicates which data associated with the column addresses is associated with the identified failed cells.

In one embodiment, the fail cell column address information further includes flag information, the flag information indicating whether the fail cell column address information is valid.

In one embodiment, the fail cell column address information further includes parity information, and the parity information is for correcting errors in the fail cell column address information.

In one embodiment, the fail cell column address information further includes recovery mode information respectively indicating which one of at least two recovery operations to perform for each of the column addresses.

In one embodiment, the recovery operation is an error correction operation.

In one embodiment, the recovery operation is a data replacement operation.

At least one embodiment relates to a method.

In one embodiment, the method includes storing fail cell information in memory. The fail cell information identifies failed cells in the first region. The method further includes transferring a portion of the fail cell information to a first region of a memory array; determining whether to perform a recovery operation based on address information in an access request and the portion of the fail cell information stored in the first region, and the access request being a request to access a second region of the memory array; and performing a recovery operation if the determining determines to perform the recovery operation.

In another embodiment, the method includes storing fail cell information in a memory, the fail cell information identifying failed cells in a memory array; and transferring only fail cell column address information in the fail cell information to the memory array. The fail cell column address information indicates column addresses of the identified failed cells. The method further includes determining whether to perform a recovery operation based on address information in an access request and the fail cell column address information stored in the memory array. The access request is a request to access the memory array. The method still further includes performing the recovery operation if the control logic determines to perform the recovery operation.

BRIEF DESCRIPTION OF THE DRAWINGS

Some example embodiments of the inventive concepts will be more clearly understood from the following detailed description taken in conjunction with the accompanying drawings in which:

FIGS. 3A through 3C are diagrams for describing an X8 mode operation of the memory device of FIG. 1;

FIG. 15 is a flowchart of a method of operating the memory device of FIG. 14;

DETAILED DESCRIPTION OF THE EMBODIMENTS

Figure 1:
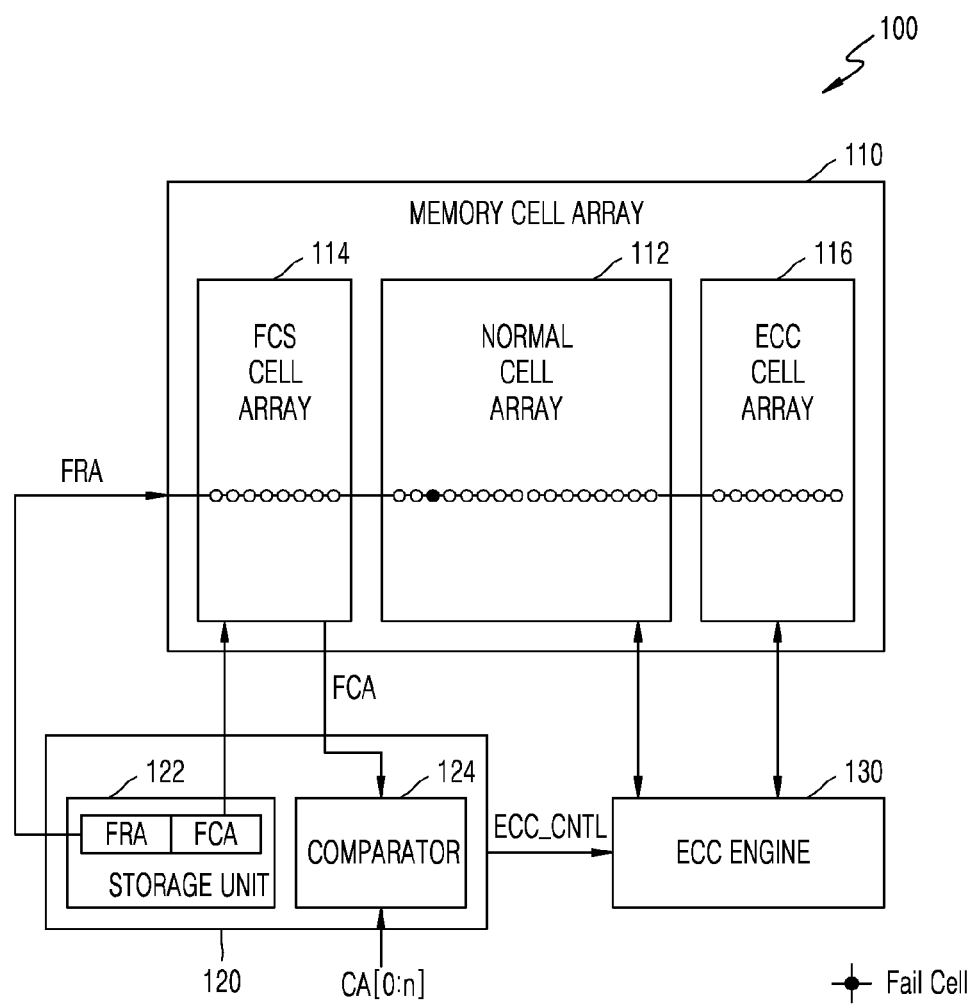
FIG. 1 is a diagram of a memory device capable of quickly repairing a fail cell, according to an embodiment of the inventive concepts.

Detailed example embodiments of the inventive concepts are disclosed herein. However, specific structural and functional details disclosed herein are merely representative for purposes of describing example embodiments of the inventive concepts. Example embodiments of the inventive concepts may, however, be embodied in many alternate forms and should not be construed as limited to only the embodiments set forth herein.

Accordingly, while example embodiments of the inventive concepts are capable of various modifications and alternative forms, embodiments thereof are shown by way of example in the drawings and will herein be described in detail. It should be understood, however, that there is no intent to limit example embodiments of the inventive concepts to the particular forms disclosed, but to the contrary, example embodiments of the inventive concepts are to cover all modifications, equivalents, and alternatives falling within the scope of example embodiments of the inventive concepts. Like numbers refer to like elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein. As used herein, expressions such as "at least one of," when preceding a list of elements, modify the entire list of elements and do not modify the individual elements of the list.

A memory capacity of semiconductor memory devices, such as a dynamic random access memory (DRAM), is increasing with the development of manufacturing process technologies. However, progress with respect to microfabrication process technology has resulted in an increase in the number of fail memory cells. In order to secure a better yield, fail memory cells may be repaired by being replaced with redundant memory cells or by using an error correction code (ECC) operation.

FIG. 1 is a diagram of a memory device 100 capable of quickly repairing a fail cell, according to an embodiment of the inventive concepts.

Referring to FIG. 1, the memory device 100 performs an ECC operation to repair a fail cell. The memory device 100 includes a memory cell array 110, a control logic unit 120, and an ECC engine 130.

The memory cell array 110 includes a plurality of memory cells arranged in rows and columns. In the memory cell array 110, the rows include word lines accessed by a row decoder, and the columns include bit lines accessed by a column decoder. Memory cells connected to intersections of the word lines and bit lines may be DRAM cells.

The memory cell array 110 may include a normal cell array 112, a fail cell information storage cell array 114, and an ECC cell array 116. The normal cell array 112 is a memory block that determines a memory capacity of the memory device 100. A fail cell indicated by ● in FIG. 1 may exist in the normal cell array 112, from among memory cells connected in one row. Examples of the fail cell include a defective cell in terms of hardware and a cell showing deterioration in various device characteristics, for example, a cell having a short refresh time, a cell showing deterioration in a cell write characteristic, and a cell having a variable retention time. A row and a column connected to the fail cell may be addressed by a fail row address FRA and a fail column address FCA.

The fail cell information storage cell array 114 is a memory block that copies and stores fail cell information stored in a storage unit 122 of the control logic unit 120. The storage unit 122 may store the fail row address FRA and the fail column address FCA of the fail cell in the normal cell array 112. The fail cell information storage cell array 114 may store the fail column address FCA in memory cells accessed by the fail row address FRA.

The fail column address FCA may be generated according to a column select signal for selecting bit lines connected to the fail cell through the column decoder. The fail column address FCA stored in the fail cell information storage cell array 114 is a fail column select signal (FCS) for accessing the fail cell of the normal cell array 112. Thus, the fail cell information storage cell array 114 may actually be a memory block that stores an FCS. For convenience of description, the fail cell information storage cell array 114 will now be referred to as the FCS cell array 114.

The FCS cell array 114 may copy and store the fail cell information including the fail column address FCA in the memory cells accessed by the fail row address FRA from the storage unit 122 of the control logic unit 120, and provide the stored fail column address FCA to a comparator 124 of the control logic unit 120. The comparator 124 may compare the fail column address FCA output from the memory cells of the fail row address FRA of the FCS cell array 114 with an access address of a write or read operation of the memory device 100.

The comparator 124 may compare the access address with the fail row address FRA and the fail column address FCA output from the FCS cell array 114 to obtain a comparison result quicker than when the access address is compared with the fail row address FRA and the fail column address FCA in the storage unit 122. When the access address matches the fail row address FRA and the fail column address FCA, whether to perform an ECC operation on memory cells corresponding to the fail row address FRA and the fail column address FCA may be quickly determined.

When there is one fail cell in memory cells connected to one row in the normal cell array 112, the ECC cell array 116 is used to repair the one fail cell. The ECC cell array 116 may store parity bits to perform an ECC operation on the fail cell. The parity bits may be generated by the ECC engine 130.

The control logic unit 120 may determine whether an access address applied from an external source outside the memory device 100 addresses the fail cell. The control logic unit 120 may store fail cell information including the fail row address FRA and the fail column address FCA generated in the normal cell array 112. The control logic unit 120 may compare the fail row address FRA and the fail column address FCA output from the FCS cell array 114 with the access address applied from the external source, and determine whether to perform an ECC operation based on a result of the comparison. The control logic unit 120 may include the storage unit 122 for storing the fail cell information, and the comparator 124 for comparing the fail column address FCA output from the FCS cell array 114 with an access column address CA[0:n].

The storage unit 122 may store the fail cell information about the fail cell generated in the normal cell array 112. The fail cell information may include the fail row address FRA and the fail column address FCA, ordering information indicating a location of the fail cell, and master information indicating that the fail cell information is true. The fail cell information may be obtained during a test process performed while manufacturing the memory device 100. If there is one fail cell from among the memory cells connected to the fail row address FRA, the storage unit 122 may store a column address of the one fail cell in the fail column address FCA. The fail cell information may be stored in the storage unit 122 when the memory device 100 is shipped.

The storage unit 122 may enable a word line of the memory cell array 110, which corresponds to the fail row address FRA, during initialization according to power-up of the memory device 100. The storage unit 112 may store the fail cell information including the fail column address FCA in the memory cells of the FCS cell array 114, from among the memory cells connected to the word line of the fail row address FRA.

According to some embodiments, the storage unit 122 may be a one-time programmable memory, such as a laser-programmable fuse array, an anti-fuse array, or an electrical programmable fuse array, or may be a nonvolatile memory device, such as a magnetic random access memory (MRAM), a resistance random access memory (RRAM), a phase change random access memory (PRAM), or a flash memory.

The comparator 124 may receive the access column address CA[0:n], and may receive the fail column address FCA from the FCS cell array 114. If the access column address CA[0:n] and the fail column address FCA match each other, the comparator 124 may output an ECC control signal ECC_CNTL. The ECC control signal ECC_CNTL may be provided to the ECC engine 130 so that the ECC operation is performed on the fail row address FRA and the fail column address FCA of the normal cell array 112.

The ECC engine 130 may perform the ECC operation on the fail cell of the normal cell array 112 in response to the ECC control signal ECC_CNTL. The ECC engine 130 may generate parity bits with respect to write data bits written to the memory cells of the normal cell array 112 including the fail cell, and store the generated parity bits in the ECC cell array 116. The ECC engine 130 may detect and correct an error bit included in read data bits by using the read data bit read from the memory cells including the fail cell of the normal cell array 112, and the parity bits read from the ECC cell array 116.

The ECC engine 130 may perform the ECC operation on the fail cell information stored in the FCS cell array 114, in response to the ECC control signal ECC_CNTL. The ECC engine 130 may generate the parity bits by performing the ECC operation on the fail cell information stored in the FCS cell array 114, and store the generated parity bits in the FCS cell array 114. The ECC engine 130 may detect and correct an error bit included in the fail cell information by using the fail cell information read from the FCS cell array 114 and the parity information.

Figure 2:
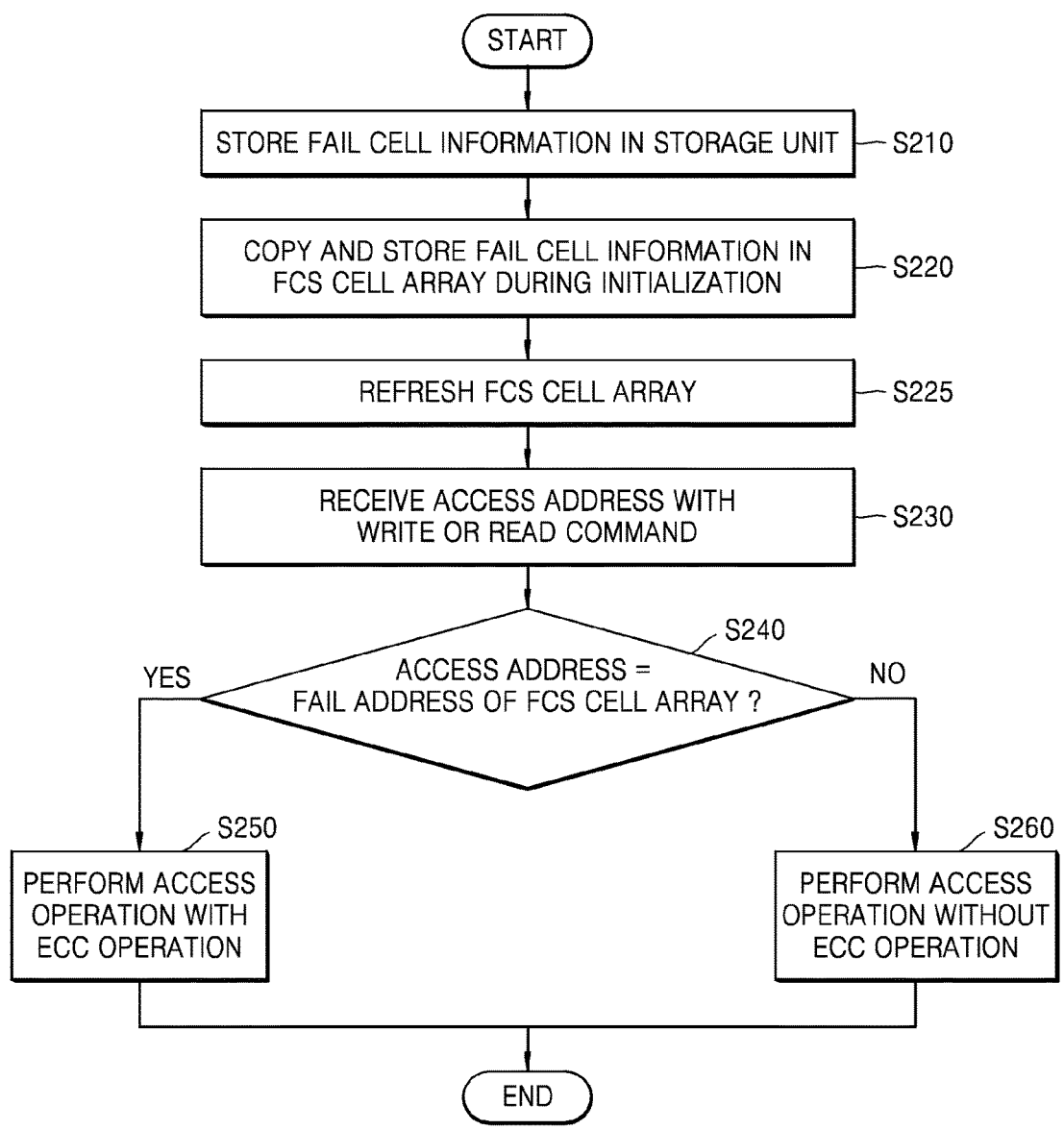
FIG. 2 is a flowchart of a method of operating the memory device of FIG. 1.

FIG. 2 is a flowchart of a method of operating the memory device 100 of FIG. 1.

Referring to FIG. 2 and FIG. 1, the memory cells of the memory cell array 110 may be determined to be good or bad during a test process of the memory device 100. The memory device 100 may store fail cell information about a fail cell screened during the test process, in the storage unit 122, in operation S210.

The fail cell information may include a fail cell address including a 1-bit error from data written to or read from memory cells of one unit group. The fail cell address may include the fail row address FRA and the fail column address FCA. The storage unit 122 may store the fail row address FRA and the fail column address FCA, which address the memory cells in one unit group including the fail cell. The number of memory cells in one unit group may be 8, 16, 32, 64, or 128.

The memory device 100 may perform initialization according to power-up when power is supplied to the memory device 100. The memory device 100 may include a mode register that provides a plurality of operation options of the memory device 100. During the initialization of the memory device 100, the mode register may program various functions, characteristics, and modes of the memory device 100. For example, the mode register may program a burst length, a read burst type, column address strobe (CAS) latency, delay-locked loop (DLL) enable/disable, output drive strength, additive latency, a power-down mode, and a data mask function.

During the initialization of the memory device 100, the fail cell information stored in the storage unit 122 may be copied and stored in the FCS cell array 114 of the memory cell array 110, in operation S220. The memory device 100 enables the word line of the memory cell array 110, which corresponds to the fail row address FRA of the storage unit 122, and stores the fail column address FCA of the storage unit 122 in the memory cells of the FCS cell array 114 from among the memory cells connected to the word line of the fail row address FRA. The FCS cell array 114 will periodic refresh the data stored therein in operation S225. While shown sequentially in the flow chart of FIG. 2, it will be understood that the refresh operation is a separate periodic operation.

The memory device 100 may receive a write or read command from a memory controller or a memory buffer. The memory device 100 may receive an access address together with the write or read command, in operation S230. The access address may include an access row address and an access column address.

The memory device 100 may determine whether the access address matches a fail address of the FCS cell array 114, in operation S240. If the access row address matches the fail row address FRA of the fail cell, the word line of the memory cell array 110, which corresponds to the fail row address FRA, may be enabled. The fail column address FCA stored in the memory cells of the FCS cell array 114, from among the memory cells connected to the word line of the fail row address FRA, may be read and provided to the comparator 124. The comparator 124 may determine whether the fail column address FCA and the access column address CA[0:n] match each other.

If it is determined that the fail column address FCA and the access column address CA[0:n] match each other in operation S240, the memory device 100 may perform the access operation (e.g., read or write) with the ECC operation on the memory cells of the normal cell array 112, which correspond to the fail address, in operation S250. If the access column address CA[0:n] and the fail column address FCA match each other, the comparator 124 may generate and provide the ECC control signal ECC_CNTL to the ECC engine 130. The ECC engine 130 may perform the ECC operation on the memory cells of the normal cell array 112, which correspond to the fail row address FRA and the fail column address FCA, in response to the ECC control signal ECC_CNTL. For example, if reading, the ECC engine 130 performs error correction on the read data from the memory cell array 110 using the parity bits also read from the ECC cell array 116. If writing, the ECC engine 130 generates parity bits from the write data. The write data is stored in the memory cell array 110 and the parity bits are stored in the ECC cell array 116.

If it is determined that the fail column address FCA and the access column address CA[0:n] do not match in operation S240, the memory device 100 may perform a read or write operation on the memory cells of the normal cell array 112, which corresponds to the access address, without an ECC operation in operation S260.

According to the method of the current embodiment, the fail row address FRA and the fail column address FCA stored in the storage unit 122 may be copied and stored in the FCS cell array 114 during the initialization of the memory device 100. The fail row address FRA and the fail column address FCA stored in the FCS cell array 114 may be compared with the access address for performing the write or read operation of the memory device 100, and whether to perform the ECC operation on the memory cells corresponding to the access address may be determined based on a result of the comparison.

According to the method, the comparison result may be quickly obtained since only the access column address of the access address is compared with the fail column address FCA, and the access row address of the access address is not used. Also, since the access column address is compared with the fail column address FCA output from the FCS cell array 114, the comparison result may be obtained quicker than when the access column address is compared with the fail row address FRA and the fail column address FCA of the storage unit 122. Based on such a comparison result, the fail cell included in the memory cells addressed by the fail row address FRA and the fail column address FCA may be repaired via the ECC operation.

Figure 3A:
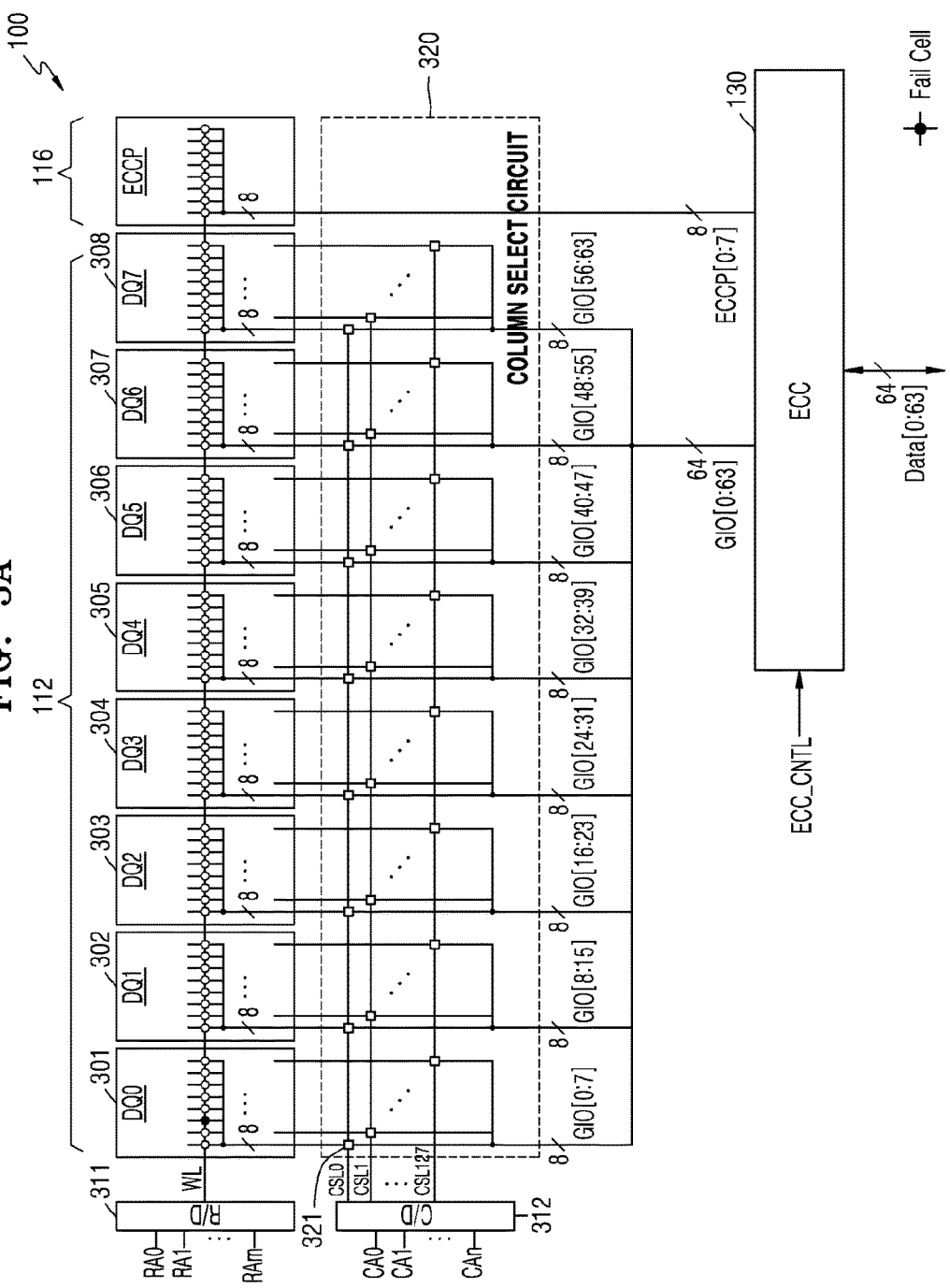

FIGS. 3A through 3C are diagrams for describing an X8 mode operation of the memory device 100 of FIG. 1.

Referring to FIG. 3A, the memory device 100 may support an X8 mode, wherein pieces of data written to or read from the memory cells in one unit group of the normal cell array 112 are input and output through 8 data input/output (IO) pads DQ0 through DQ7. The ECC operation may be performed to repair an error bit included in data bits in one unit group written to or read from the memory cells in one unit group of the normal cell array 112. According to the current embodiment, the number of memory cells in one unit group may be 64, and the number of data bits in one unit group may be 64 bits.

The normal cell arrays 112 may include a plurality of normal cell blocks 301 through 308. The normal cell blocks 301 through 308 may each include a plurality of memory cells arranged in rows and columns. Since pieces of data stored in the memory cells of the normal cell blocks 301 through 308 may be input or output respectively to or from the data IO pads DQ0 through DQ7, for convenience of description, the normal cell blocks 301 through 308 will now be referred to as DQ0 to DQ7 cell blocks 301 through 308.

In each of the DQ0 to DQ7 cell blocks 301 through 308, rows may include, for example, 8K word lines WL and columns may include, for example, 1K bit lines BL. Memory cells connected to intersections of the word lines WL and the bit lines BL may be DRAM cells indicated by ○. In the DQ0 to DQ7 cell blocks 301 through 308, the word lines WL are accessed by row addresses RA0 through RAm, and the bit lines BL are accessed by column addresses CA0 through CAn.

The row addresses RA0 through RAm are decoded by a row decoder 311, and the word line WL is selected by the decoded row addresses RA0 through RAm. The column addresses CA0 through CAn are decoded by a column decoder 312. The column decoder 312 generates column select signals CSL0 through CSL127 for selecting the bit lines BL by decoding the column addresses CA0 through CAn. To support a burst length representing a maximum number of column locations for accessing the bit lines BL, bit lines BL corresponding to the burst length may be simultaneously accessed.

For example, the memory device 100 may set the burst length to be 8. Accordingly, the bit lines BL may be connected to column selectors 321 to which the 128 column select signals CSL0 through CSL127 are supplied, respectively, and 8 bit lines BL may be simultaneously selected by one of the column selectors 321. The column selectors 321 may each include 8 switches, and are turned on by the column select signals CSL0 through CSL127, respectively. The column selectors 321 that are turned on or off by the column select signals CSL0 through CSL127 may form a column select circuit 320.

In the DQ0 cell block 301, a plurality of memory cells may be connected to the word line WL accessed by the row addresses RA0 through RAm. 8 of the plurality of memory cells connected to the word line WL may be selected by a respective column selector 321 connected to the column select signal CSL0 and connected to first data lines GIO[0:7]. The first data lines GIO[0:7] may include 8 bits.

In the DQ1 cell block 302 as well, 8 of a plurality of memory cells connected to the word line WL may be selected by respective column selector 321 to which the column select signal CSL0 is provided, and connected to second data lines GIO[8:15]. Also, in each of the other DQ2 to DQ7 cell blocks 303 to 308, 8 of a plurality of memory cells connected to the word lines WL are selected by respective column selector 321 to which the column select signal CSL0 is provided, and connected to corresponding data lines among third to eighth data lines GIO[16:23] to GIO[56:63]. This description equally applies to column select signals CSL1 to CSL127.

In the memory device 100, pieces of data Data[6:23] to be written to the DQ0 to DQ7 cell blocks 301 through 308 may be transmitted to the first through eighth data lines GIO[0:63]. Via the first through eighth data lines GIO[0:63], pieces of first to eighth burst data that are to be respectively written to the DQ0 to DQ7 cell blocks 301 to 308, i.e., a total of 64 bits of data Data[0:63], may be received, respectively. The received data Data[0:63] may be written to eight memory cells of each of the DQ0 to DQ7 cell blocks 301 through 308 selected by the column selection unit 321 to which, for example, the column select signal CSL0 is supplied from among the plurality of memory cells connected to the word lines WL. This description equally applies to column select signals CSL1 to CSL127.

If one fail cell exists in the memory cells connected to one word line WL in the DQ0 to DQ7 cell blocks 301 to 308, the ECC cell array 116 may be used to repair the fail cell. For example, one fail cell (indicated by ●) may exist in the DQ0 cell block 301 from among the memory cells of the DQ0 to DQ7 cell blocks 301 through 308 selected by the word lines WL and the column selector 321 to which the column select signal CSL0 is provided. On the other hand, the fail cell may not be the fail cell of the DQ0 cell block 301, but may be any fail cell generated in the memory cells of the DQ1 to DQ7 cell blocks 302 through 308 selected by the word line WL and the column selector 321 to which the column select signal CSL0 is provided. The ECC cell array 116 may be controlled by the ECC engine 130, and may be used to detect and correct a fail cell in any of the DQ0 to DQ7 cell blocks 301 through 308.

Like the DQ0 to DQ7 cell blocks 301 through 308, the ECC cell array 116 may include 8K word lines WL. Unlike the DQ0 to DQ7 cell blocks 301 through 308, the ECC cell array 116 may include 8 bit lines BL. Memory cells connected to intersections of the word lines WL and the bit lines BL of the ECC cell array 116 may also be DRAM cells.

In the ECC cell array 116, eight bit lines BL are connected to parity data lines ECCP[0:7]. Parity bits regarding the data Data[0:63] stored in a fail cell of any of the DQ0 to DQ7 cell blocks 301 through 308 may be transmitted to the parity data lines ECCP[0:7]. The parity bits may be stored in and read from eight memory cells in the ECC cell array 116 via the parity data lines ECCP[0:7]. In this case, the eight memory cells of the ECC cell array 116 may be connected to the word line WL to which the fail cell is also connected.

The ECC engine 130 may detect and correct a fail cell of the DQ0 to DQ7 cell blocks 301 through 308, in response to the ECC control signal ECC_CNTL. During a write operation, the ECC engine 130 may generate parity bits with respect to the data Data[0:63] received from a memory controller or a memory buffer, and transmit the parity bits to the parity data lines ECCP[0:7], in response to the ECC control signal ECC_CNTL. The parity bits on the parity data lines ECCP[0:7] may be stored in the memory cells of the ECC cell array 116 connected to the word line WL of the fail cell.

During a read operation, the ECC engine 130 may receive data transmitted to the first through eighth data lines GIO[0:63] and data transmitted to the parity data lines ECCP[0:7], in response to the ECC control signal ECC_CNTL. The data transmitted to the first through eighth data lines GIO[0:63] is data read from the memory cells of the DQ0 to DQ7 cell blocks 301 through 308, which are connected to the word line WL of the fail cell, and the data transmitted to the parity data lines ECCP[0:7] is parity bits read from the memory cells of the ECC cell array 116, which are connected to the word line WL of the fail cell.

The ECC engine 130 may detect and correct an error bit caused by the fail cell, by using the data transmitted to the first through eighth data lines GIO[0:63] and the parity data lines ECCP[0:7]. The ECC engine 130 may receive the data transmitted to the first through eighth data lines GIO[0:63] and the parity data lines ECCP[0:7], generate syndrome data, calculate a location of the fail cell, i.e., an error bit location, correct data corresponding to the error bit location, and output the data Data[0:63] having the corrected error bit.

The memory device 100 may support the x8 mode, wherein pieces of data corresponding to a burst length of 8 are input and output to and from the 8 data IO pads DQ0 through DQ7. As shown in FIGS. 3B and 3C, first through eighth burst data, i.e., total 64 bits of data Data[0:63], may be output from the DQ0 to DQ7 cell blocks 301 through 308 to the data IO pads DQ0 through DQ7, respectively.

Referring to FIG. 3B, at a time T0, first burst data, i.e., Data0, Data8, Data16, Data24, Data32, Data40, Data48, and Data56 may be output respectively to the data IO pads DQ0 through DQ7. At a time T1, second burst data, i.e., Data1, Data9, Data17, Data25, Data33, Data41, Data49, and Data57 may be output. At a time T2, third burst data, i.e., Data2, Data10, Data18, Data26, Data34, Data42, Data50, and Data58 may be output. Then, at times T3 through T7, fourth through eighth burst data may be output, respectively.

The memory device 100 may be required to perform a burst chop (BC) function. The memory device 100 may, for example, output the first through fourth burst data at times T1 through T3 according to BC=4. The memory device 100 may drive the ECC engine 130 to detect and correct an error bit with respect to the first through fourth burst data.

The ECC engine 130 may generate parity bits ECCP0[0:3] with respect to the first burst data. The ECC engine 130 may generate parity bits ECCP1[0:3] with respect to the second burst data. Similarly, the ECC engine 130 may generate parity bits ECCP2[0:3] and ECCP3[0:3] with respect to the third and fourth burst data. Namely, each burst at a respective time slot T0, T1, etc. is a ECC coding unit for the ECC engine 130.

The ECC engine 130 may store the parity bits ECCP0[0:3], ECCP1[0:3], ECCP2[0:3], and ECCP3[0:3] generated with respect to the first through fourth burst data, in the ECC cell array 116. The ECC engine 130 may detect and correct errors of the first through fourth burst data by using, respectively, the first through fourth burst data read from the DQ0 to DQ7 cell blocks 301 through 308 and the parity bits ECCP0[0:3], ECCP1[0:3], ECCP2[0:3], and ECCP3[0:3] read from the ECC cell array 116.

Referring to FIG. 3C, the memory device 100 may be required to perform a data mask function. The memory device 100 may perform a data mask operation on, for example, the second, fourth, sixth, and eighth burst data. The memory device 100 may drive the ECC engine 130 to detect and correct an error bit with respect to the first, third, fifth, and seventh burst data that are not masked.

The ECC engine 130 may perform an ECC operation on burst data that is not masked. The ECC engine 130 may generate the parity bits ECCP0[0:3] with respect to the first burst data, i.e., Data0, Data8, Data16, Data24, Data32, Data40, Data48, and Data56. The ECC engine 130 may generate the parity bits ECCP2[0:3] with respect to the third burst data, i.e., Data2, Data10, Data18, Data26, Data34, Data42, Data50, and Data58. Similarly, the ECC engine 130 may generate parity bits ECCP4[0:3] and ECCP6[0:3] with respect to the fifth and seventh burst data.

The ECC engine 130 may store the parity bits ECCP0[0:3], ECCP2[0:3], ECCP4[0:3], and ECCP6[0:3] in the ECC cell array 116. The ECC engine 130 may detect and correct error bits of the first, third, fifth, and seventh burst data by using, respectively, the first, third, fifth, and seventh burst data read from the DQ0 to DQ7 cell blocks 301 through 308 and the parity bits ECCP0[0:3], ECCP2[0:3], ECCP4[0:3], and ECCP6[0:3] read from the ECC cell array 116.

The memory device 100 according to the current embodiment may support the X8 mode since 64 data bits having a burst length of 8 with respect to each of the DQ0 to DQ7 cell blocks 301 through 308 are input to and output from the data IO pads DQ0 through DQ7, respectively. The memory device 100 may be required to support an X4 mode as well as the X8 mode, according to user demand. If the memory device 100 in the X8 mode may also operate in X4 mode, compatibility of the memory device 100 may improve. At this time, the ECC operation for repairing a fail cell in the memory device 100 may also be required to adaptively operate in the X4 mode.

Figure 4:
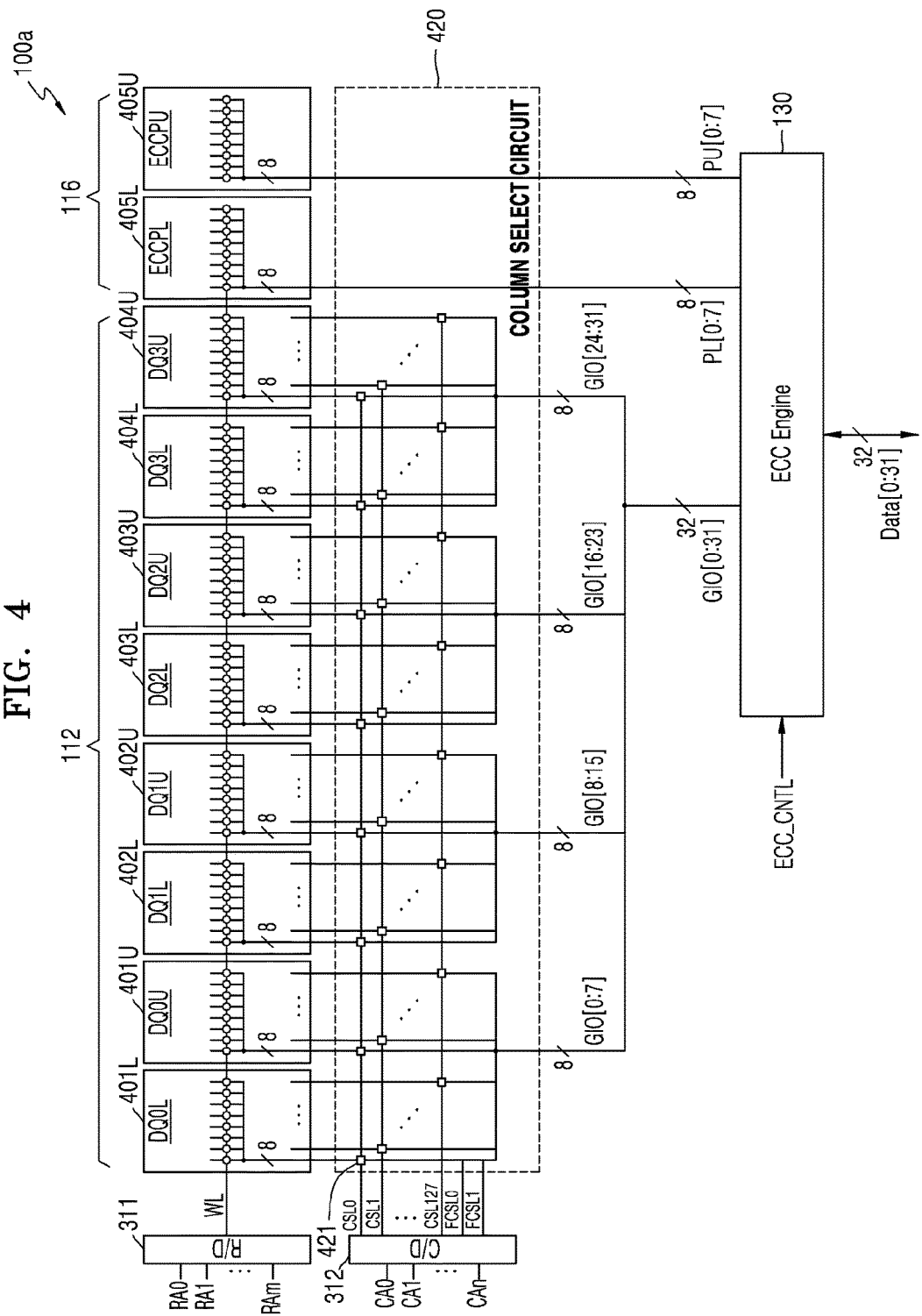
FIG. 4 is a diagram for describing an X4 mode operation of a memory device according to an embodiment of the inventive concepts.

FIG. 4 is a diagram for describing an X4 mode operation of a memory device 100a according to an embodiment of the inventive concepts.

Referring to FIG. 4, the number of data bits in one unit group may be 32 bits for the memory device 100a to support an X4 mode. In the normal cell array 112, a DQ0L cell block 401L may correspond to the DQ0 cell block 301 of FIG. 3. Also, a DQ0U cell block 401U may correspond to the DQ1 cell block 302, a DQ1L cell block 402L may correspond to the DQ2 cell block 303, a DQ1U cell block 402U may correspond to the DQ3 cell block 304, a DQ2L cell block 403L may correspond to the DQ4 cell block 305, a DQ2U cell block 403U may correspond to the DQ5 cell block 306, a DQ3L cell block 404L may correspond to the DQ6 cell block 307, and a DQ3U cell block 404U may correspond to the DQ7 cell block 308.

The DQ0L, DQ1L, DQ2L, and DQ3L cell blocks 401L, 402L, 403L, and 404L are cell blocks with an 'L' suffix, wherein L denotes 'lower', and DQ0U, DQ1U, DQ2U, and DQ3U cell blocks 401U, 402U, 403U, and 404U are cell blocks with an 'U' suffix, wherein U denotes 'upper'. In order to support an X4 mode, 32 data bits corresponding to a burst length of 8 may be input or output with respect to the DQ0L to DQ3L cell blocks 401L through 404L. Also, 32 data bits corresponding to a burst length of 8 may be input or output with respect to the DQ0U to DQ3U cell blocks 401U through 404U.

Figure 5A:
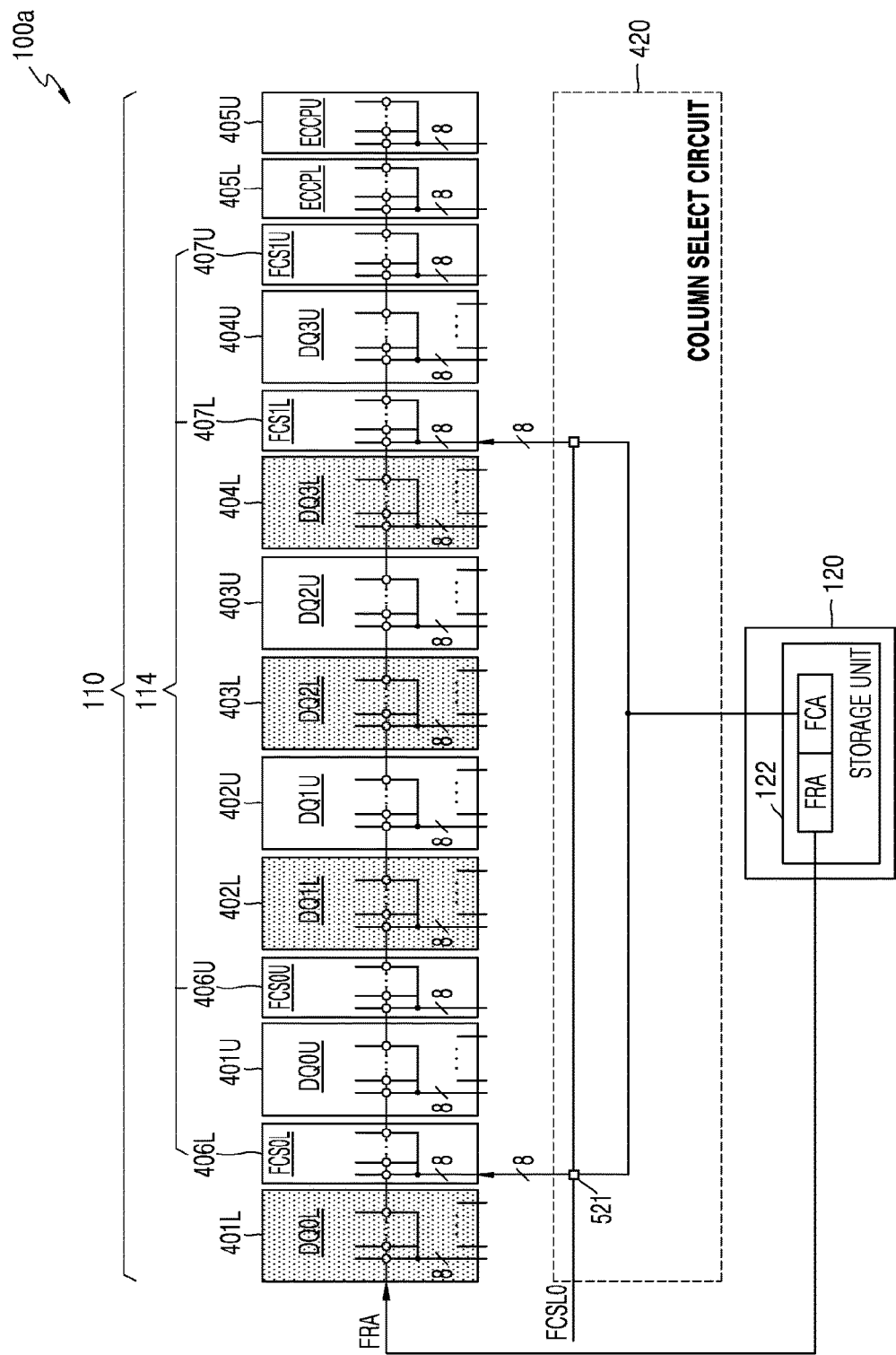
FIGS. 5A and 5B are diagrams of a fail column select signal (FCS) cell array of the memory device of FIG. 4, according to some embodiments of the inventive concepts.
Figure 5B:
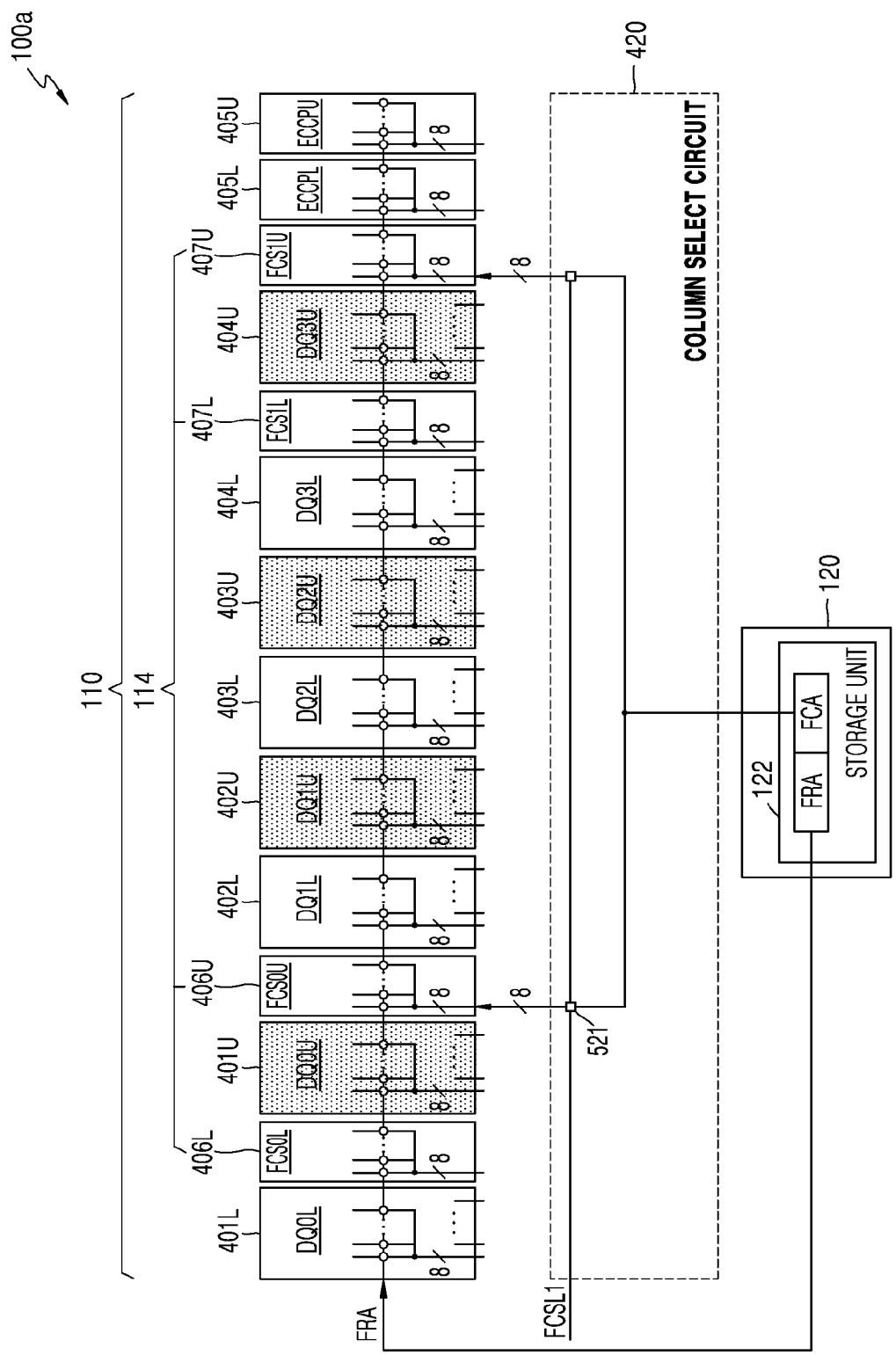

Bit lines BL of the DQ0L to DQ3L cell blocks 401L through 404L and the DQ0U to DQ3U cell blocks 401U through 404U may be connected to a column select circuit 420 including a column selector 421 connected to each of the 128 column select signals CSL0 through CSL127. As shown in FIGS. 5A and 5B, the column select circuit 420 may include a column selector 521 that selects bit lines of FCS0L and FCS1L cell blocks 406L and 407L and FCS0U and FCS1U cell blocks 406U and 407U in the FCS cell array 114. The column selector 521 may be provided with FCS column select signals FCSL0 and FCSL1. The column select signals CSL0 through CSL127, FCSL0, and FCSL1 may be provided from a column decoder that decodes the column addresses CA0 through CAn.

The column select circuit 420 may use the access column address CA[0:n] that generates the column select signals CSL0 through CSL127 such that the DQ0L to DQ3L cell blocks 401L through 404L are selected or the DQ0U to DQ3U cell blocks 401U through 404U are selected. For example, when the column address CA11 is '0' bit, the DQ0L to DQ3L cell blocks 401L through 404L may be selected, and when the column address CA11 is '1' bit, the DQ0U to DQ3U cell blocks 401U through 404U may be selected.

The DQ0L cell block 401L and the DQ0U cell block 401U may share first data lines GIO[0:7], the DQ1L cell block 402L and the DQ1U cell block 402U may share second data lines GIO[8:15], the DQ2L cell block 403L and the DQ2U cell block 403U may share third data lines GIO[16:23], and the DQ3L cell block 404L and the DQ3U cell block 404U may share fourth data lines GIO[24:31].

The data Data[0:31] to be written to the DQ0L to DQ3L cell blocks 401L through 404L may be transmitted to the first through fourth data lines GIO[0:31]. First through eighth burst data, i.e., total 32 bits of the data Data[0:31], to be respectively written to the DQ0L to DQ3L cell blocks 401L through 404L may be received respectively through the first through fourth data lines GIO[0:31]. The received 32 bits of the data Data[0:31] may be written to 8 memory cells of each of the DQ0L to DQ3L cell blocks 401L through 404L through the column select circuit 420 that is set to select the DQ0L to DQ3L cell blocks 401L through 404L.

The data Data[0:31] to be written to the DQ0U to DQ3U cell blocks 401U through 404U may be transmitted to the first through fourth data lines GIO[0:31]. The first through eighth burst data, i.e., total 32 bits of the data Data[0:31], to be respectively written to the DQ0U to DQ3U cell blocks 401U through 404U may be received respectively through the first through fourth data lines GIO[0:31]. The received 32 bits of the data Data[0:31] may be written to 8 memory cells of each of the DQ0U to DQ3U cell blocks 401U through 404U through the column select circuit 420 that is set to select the DQ0U to DQ3U cell blocks 401U through 404U.

The ECC cell array 116 may include an ECCPL cell block 405L and an ECCPU cell block 405U. If there is one fail cell in memory cells connected to one word line WL in the DQ0L to DQ3L cell blocks 401L through 404L, the ECCPL cell block 405L may be used to repair the one fail cell. If there is one fail cell in memory cells connected to one word line WL in the DQ0U to DQ3U cell blocks 401U through 404U, the ECCPU cell block 405U may be used to repair the one fail cell.

Like the DQ0L to DQ3L cell blocks 401L through 404L and the DQ0U to DQ3U cell blocks 401U through 404U, each of the ECCLPL cell block 405L and the ECCPU cell block 405U may include, for example, 8K word lines WL. Unlike the DQ0L to DQ3L cell blocks 401L through 404L and the DQ0U to DQ3U cell blocks 401U through 404U, each of the ECCLPL cell block 405L and the ECCPU cell block 405U may include, for example, 8 bit lines BL.

The 8 bit lines BL of the ECCPL cell block 405L may be connected to first parity data lines PL[0:7]. First parity bits regarding the data Data[0:31] stored in the fail cell of the DQ0L to DQ3L cell blocks 401L through 404L may be transmitted to the first parity data lines PL[0:7]. The first parity bits may be stored in and read from the 8 memory cells in the ECCPL cell block 405L through the first parity data lines PL[0:7]. Here, the 8 memory cells of the ECCPL cell block 405L may be connected to the word line WL of the fail cell.

The 8 bit lines BL of the ECCPU cell block 405U may be connected to second parity data lines PU[0:7]. Second parity bits regarding the data Data[0:31] stored in the fail cell of the DQ0U to DQ3U cell blocks 401U through 404U may be transmitted to the second parity data lines PU[0:7]. The second parity bits may be stored in and read from the 8 memory cells in the ECCPU cell block 405U through the second parity data lines PU[0:7]. Here, the 8 memory cells of the ECCPU cell block 405U may be connected to the word line WL of the fail cell.

In response to the ECC control signal ECC_CNTL, the ECC engine 130 may detect and correct the fail cell of the DQ0L to DQ3L cell blocks 401L through 404L. During the write operation, the ECC engine 130 may generate the first parity bits with respect to the data Data[0:31] to be written to the DQ0L to DQ3L cell blocks 401L through 404L received from a memory controller or a memory buffer and transmit the generated first parity bits to the first parity data lines PL[0:7], in response to the ECC control signal ECC_CNTL. The first parity bits on the first parity data lines PL[0:7] may be stored in the memory cells of the ECCPL cell block 405L, which are connected to the word line WL of the fail cell.

During the reading operation, the ECC engine 130 may receive read data of the DQ0L to DQ3L cell blocks 401L through 404L transmitted to the first through fourth data lines GIO[0:31] and the first parity bits of the ECCPL cell block 405L transmitted to the first parity data lines PL[0:7], in response to the ECC control signal ECC_CNTL. The ECC engine 130 may receive the read data of the first through fourth data lines GIO[0:31] and the first parity bits of first parity data lines PL[0:7], generate syndrome data, calculate an error bit location in the read data of the DQ0L to DQ3L cell blocks 401L through 404L, correct data corresponding to the error bit location, and output the data Data[0:31] having the corrected error bit.

The ECC engine 130 detects and corrects a fail cell of the DQ0U to DQ3U cell blocks 401U through 404U in response to the ECC control signal ECC_CNTL. During the write operation, the ECC engine 130 may generate the second parity bits with respect to the data Data[0:31] to be written to the DQ0U to DQ3U cell blocks 401U through 404U received from the memory controller or the memory buffer and transmit the generated second parity bits to the second parity data lines PU[0:7], in response to the ECC control signal ECC_CNTL. The second parity bits on the second parity data lines PU[0:7] may be stored in the memory cells of the ECCPU cell block 405U connected to the word line WL of the fail cell.

During the read operation, the ECC engine 130 may receive read data of the DQ0U to DQ3U cell blocks 401U through 404U transmitted to the first through fourth data lines GIO[0:31] and the second parity bits of the ECCPU cell block 405U transmitted to the second parity data lines PU[0:7], in response to the ECC control signal ECC_CNTL. The ECC engine 130 may receive the read data of the first through fourth data lines GIO[0:31] and the second parity bits of the second parity data lines PU[0:7], generate syndrome data, calculate an error bit location in the read data of the DQ0U to DQ3U cell blocks 401U through 404U, correct data corresponding to the error bit location, and output the data Data[0:31] with the corrected error bit.

In the memory device 100a, fail cell information about the fail cell of the DQ0L to DQ3L cell blocks 401L through 404L and fail cell information about the fail cell of the DQ0U to DQ3U cell blocks 401U through 404U may be stored in the storage unit 122 of the control logic unit 120 as shown in FIG. 5A or 5B. The fail row address and the fail column address FRA and FCA stored in the storage unit 122 may be copied and stored in the FCS cell array 114 of the memory cell array 110 of FIG. 1.

FIGS. 5A and 5B are diagrams of the FCS cell array 114 of the memory device 100a of FIG. 4, according to some embodiments of the inventive concepts. In FIG. 5A, the fail cell information about the fail cell of the DQ0L to DQ3L cell blocks 401L through 404L is copied and stored in the FCS0L and FCS1L cell blocks 406L and 407L having an 'L' suffix. In FIG. 5B, the fail cell information about the fail cell of the DQ0U to DQ3U cell blocks 401U through 404U is copied and stored in the FCS0U and FCS1U cell blocks 406U and 407U having an 'U' suffix.

Referring to FIG. 5A, the memory cell array 110 may include the DQ0L to DQ3L cell blocks 401L through 404L and the DQ0U to DQ3U cell blocks 401U through 404U of the normal cell array 112, and the ECCPL cell block 405L and the ECCPU cell block 406U of the ECC cell array 116, which are described above with reference to FIG. 4. Also, the memory cell array 110 may include the FCS cell array 114 including the FCS0L, FCS0U, FCS1L, and FCS1U cell blocks 406L, 406U, 407L, and 407U. Like the ECCPL and ECCPU cell blocks 405L and 405U, each of the FCS0L, FCS0U, FCS1L, and FCS1U cell blocks 406L, 406U, 407L, and 407U may include 8K word lines WL and 8 bit lines BL.

The FCS0L cell block 406L and the FCS1L cell block 407L of the FCS cell array 114 may copy and store the fail cell information of the DQ0L to DQ3L cell blocks 401L through 404L from the storage unit 122 through operation of the respective column selector 521. The storage unit 122 may store the fail row address FRA and the fail column address FCA of the DQ0L to DQ3L cell blocks 401L through 404L and, during initialization of the memory device 100a, store the fail column address FCA in memory cells connected to the word lines WL of the fail row addresses FRA of the FCS0L cell block 406L and the FCS1L cell block 407L.

Referring to FIG. 5B, the FCS0U cell block 406U and the FCS1U cell block 407U of the FCS cell array 114 may copy and store the fail cell information of the DQ0U to DQ3U cell blocks 401U through 404U from the storage unit 122 through the column selector 521. The storage unit 122 may store the fail row address FRA and the fail column address FCA of the DQ0U to DQ3U cell blocks 401U through 404U and, during the initialization of the memory device 100a, store the fail column address FCA in memory cells connected to the word lines WL of the fail row addresses FRA of the FCS0U cell block 406U and the FCS1U cell block 407U.

In FIG. 5A, each of the FCS0L cell block 406L and the FCS1L cell block 407L may include 8 memory cells connected to the word line WL of the fail row address FRA, and thus the fail cell information of the DQ1L to DQ3L cell blocks 401L through 404L may be copied from the storage unit 122 and stored in the total 16 memory cells. The fail cell information stored in the FCS0L cell block 406L and the FCS1L cell block 407L may be indicated as shown in FIGS. 6A and 6B.

Figure 6A:
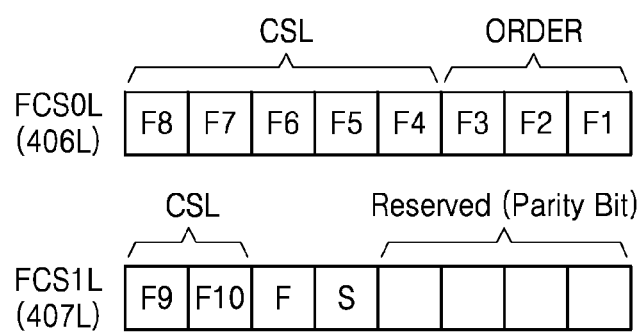
FIGS. 6A and 6B are diagrams for describing fail cell information stored in FCS cell blocks of FIG. 5A.
Figure 6B:
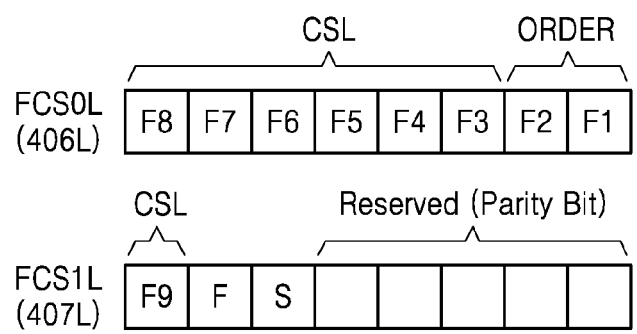

FIGS. 6A and 6B are diagrams for describing fail cell information stored in FCS cell blocks of FIG. 5A. In FIGS. 6A and 6B, the numbers of bits assigned to ordering information are different.

Referring to FIG. 6A, the 8 memory cells of the FCS0L cell block 406L and the 8 memory cells of the FCS1L cell block 407L, which are connected to the word line of the fail row address FRA, may form 16 bits. The fail cell information of the DQ0L to DQ3L cell blocks 401L through 404L may be stored by using 11 bits, i.e., 8 bits of the FCS0L cell block 406L and 3 bits from 8 bits of the FCS cell block 407L.

The 7 bits, i.e., F4, F5, F6, F7, and F8 bits of the FCS0L cell block 406L, and F9 and F10 bits of the FCS1L cell block 407L may indicate which one of the column selectors 421 of FIG. 4, to which the column select signals CSL0 through CSL127 are supplied, is connected to one fail cell generated in the DQ0L to DQ3L cell blocks 401L through 404L.

The F1, F2, and F3 bits of the FCS0L cell block 406L may store ordering information. The ordering information formed of 3 bits may indicate which of the first through eighth burst data (e.g., time slots T0, T1, etc.) described above with reference to FIG. 3B includes an error bit of a fail cell. The ordering information in 3 bits may be set to support an X8 mode of a memory device.

An M bit of the FCS1L cell block 407L may store master information indicating whether the fail cell information stored in the FCS0L cell block 406L and the FCS1L cell block 407L is true. The M bit may indicate whether there is one fail cell in the memory cells of the DQ0L to DQ3L cell blocks 401L through 404L connected to the word line of the fail row address FRA. For example, if the M bit is '0', the M bit indicates that there is no fail cell in the DQ0L to DQ3L cell blocks 401L through 404L connected to the word line of the fail row address FRA and that the fail cell information stored in the FCS0L cell block 406L and the FCS1L cell block 407L is invalid. If the M bit is '1', the M bit indicates that there is one fail cell in the DQ0L to DQ3L cell blocks 401L through 404L connected to the word line of the fail row address FRA and that the fail cell information stored in the FCS0L cell block 406L and the FCS1L cell block 407L is valid.

5 bits may be reserved from among the 8 bits of the FCS1L cell block 407L. The reserved 5 bits may be used for an ECC operation performed on the 11 bits of the fail cell information stored in the FCS0L cell block 406L and the FCS1L cell block 407L. The 5 bits may be used to perform the ECC operation on the fail cell information stored in the FCS0L cell block 406L and the FCS1L cell block 407L and generate parity bits. The parity bits with respect to the fail cell information may be stored in the reserved 5 bits of the FCS cell block 407L.

FIG. 6B is different from FIG. 6A in that ordering information is stored by using 2 bits, i.e., F1 and F2 bits of the FCS0L cell block 406L. The first through eighth burst data described above with reference to FIG. 3B may form 4 groups as the first through eighth burst data are grouped in two. The ordering information in 2 bits may indicate which one of four groups includes an error bit of a fail cell. The ordering information in 2 bits may be set to support an X4 mode of a memory device.

7 bits, i.e., F3, F4, F5, F6, F7, and F8 bits of the FCS0L cell block 406L and an F9 bit of the FCS1L cell block 407L may indicate which one of the column selectors 421 of FIG. 4, to which the column select signals CSL0 through CSL127 are supplied, is connected to one fail cell generated in the DQ0L to DQ3L cell blocks 401L through 404L. An M bit of the FCS1L cell block 407L may indicate whether there is one fail cell in the memory cells of the DQ0L to DQ3L cell blocks 401L through 404L connected to the word line of the fail row address FRA. The 6 bits that are reserved from among the 8 bits of the FCS1L cell block 407L may store parity bits with respect to the fail cell information stored in the FCS0L cell block 406L and the FCS cell block 407L.

Figure 7:
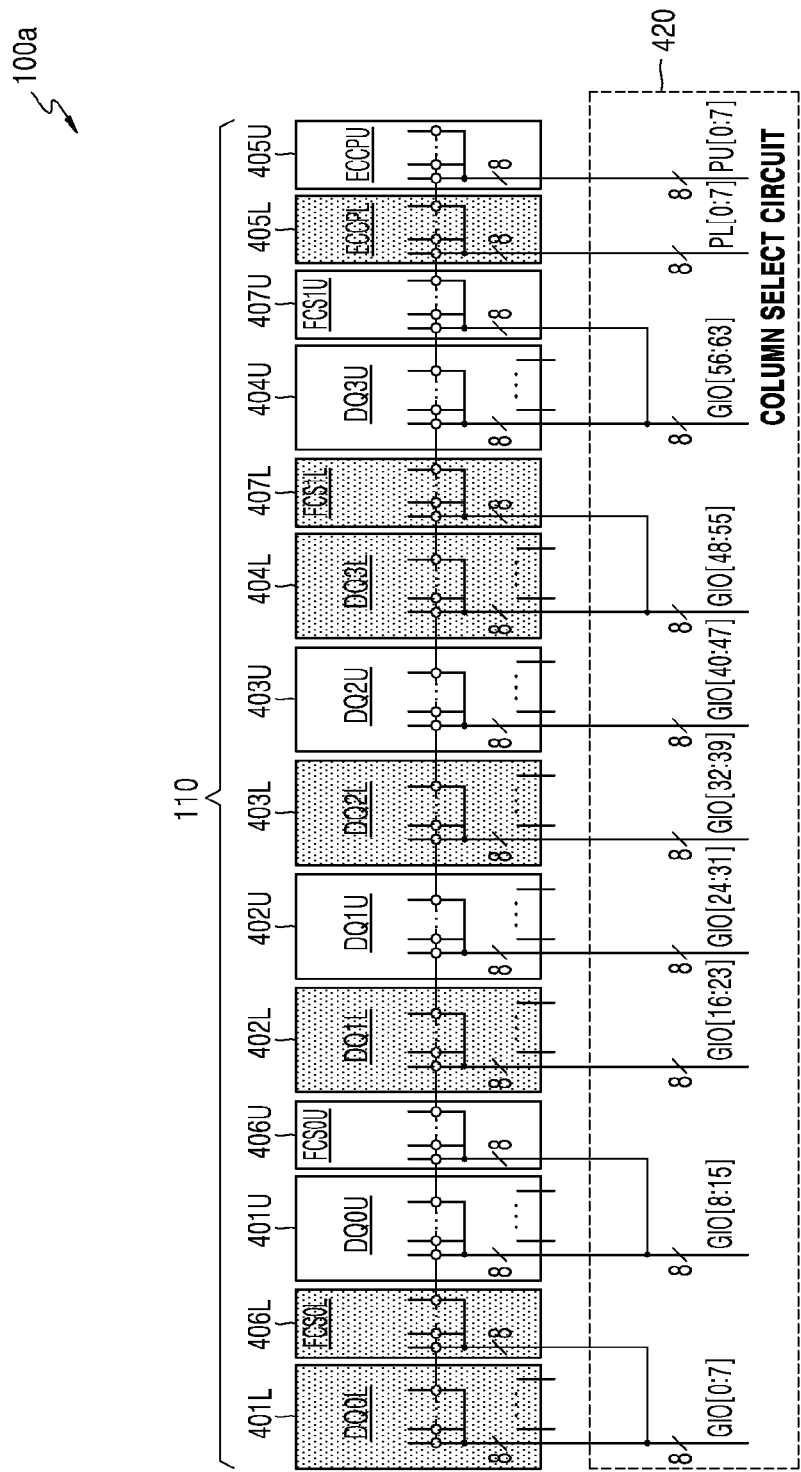
FIG. 7 is a diagram of a data line structure in the memory device of FIG. 5A.

FIG. 7 is a diagram of a data line structure in the memory device 100a of FIG. 5A. FIG. 7 illustrates the data line structure wherein FCS cell blocks share data lines of DQ cell blocks.

Referring to FIG. 7, the memory cell array 110 may include the DQ0L to DQ3L cell blocks 401L through 404L, the DQ0U to DQ3U cell blocks 401U through 404U, the ECCPL cell block 405L, the ECCPU cell block 405U, the FCS0L and FCS1L cell blocks 406L and 407L, and the FCS0U and FSC1U cell blocks 406U and 407U.

The DQ0L cell block 401L may be connected to the first data lines GIO[0:7], the DQ0U cell block 401U may be connected to the second data lines GIO[8:15], the DQ1L cell block 402L may be connected to the third data lines GIO[16:23], the DQ1U cell block 402U may be connected to the fourth data lines GIO[24:31], the DQ2L cell block 403L may be connected to the fifth data lines GIO[32:39], the DQ2U cell block 403U may be connected to the sixth data lines GIO[40:47], the DQ3L cell block 404L may be connected to the seventh data lines GIO[48:55], and the DQ3U cell block 404U may be connected to the eighth data lines GIO[56:63].

In the memory cell array 110, DRAM cells arranged in rows and columns have a small cell size due to microfabrication. In this regard, since the first through eighth data lines GIO[0:63] connected to the DRAM cells are arranged by considering line widths and line intervals, a large arrangement area is required compared to the cell size.

In order to store fail cell information in the memory cells of the FCS0L, FCS0U, FCS1L, and FCS1U cell blocks 406L, 406U, 407L, and 407U, data lines connected to the FCS0L, FCS0U, FCS1L, and FCS1U cell blocks 406L, 406U, 407L, and 407U are required. Here, a data line arrangement of the memory device 100a may be convenient if the first through eighth data lines GIO[0:63] are shared rather than separately arranging data lines connected to the FCS0L, FCS0U, FCS1L, and FCS1U cell blocks 406L, 406U, 407L, and 407U.

The FCS0L cell block 406L may share the first data lines GIO[0:7] of the DQ0L cell block 401L. The FCS0U cell block 406U may share the second data lines GIO[8:15] of the DQ0U cell block 401U, the FCS1L cell block 407L may share the seventh data lines GIO[48:55] of the DQ3L cell block 404L, and the FCS3U cell block 407U may share the eighth data lines GIO[56:63] of the DQ3U cell block 404U. Accordingly, the FCS0L cell block 406L is disposed adjacent to the DQ0L cell block 401L, the FCS0U cell block 406U is disposed adjacent to the DQ0U cell block 401U, the FCS1L cell block 407L is disposed adjacent to the DQ3L cell block 404L, and the FCS1U cell block 407U may be disposed adjacent to the DQ3U cell block 404U.

According to some embodiments, the FCS0L, FCS0U, FCS1L, and FCS1U cell blocks 406L, 406U, 407L, and 407U may be respectively disposed adjacent to the DQ1L, DQ1U, DQ2L, and DQ2U cell blocks 402L, 402U, 403L, and 403U. The FCS0L, FCS0U, FCS1L, and FCS1U cell blocks 406L, 406U, 407L, and 407U may respectively share the third, fourth, fifth, and sixth data lines GIO[16:23], GIO[24:31], GIO[32:39], and GIO[40:47].

Figure 8:
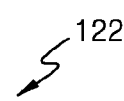
FIGS. 8 and 9 are diagrams for describing a storage unit of FIG. 1.
Figure 9:
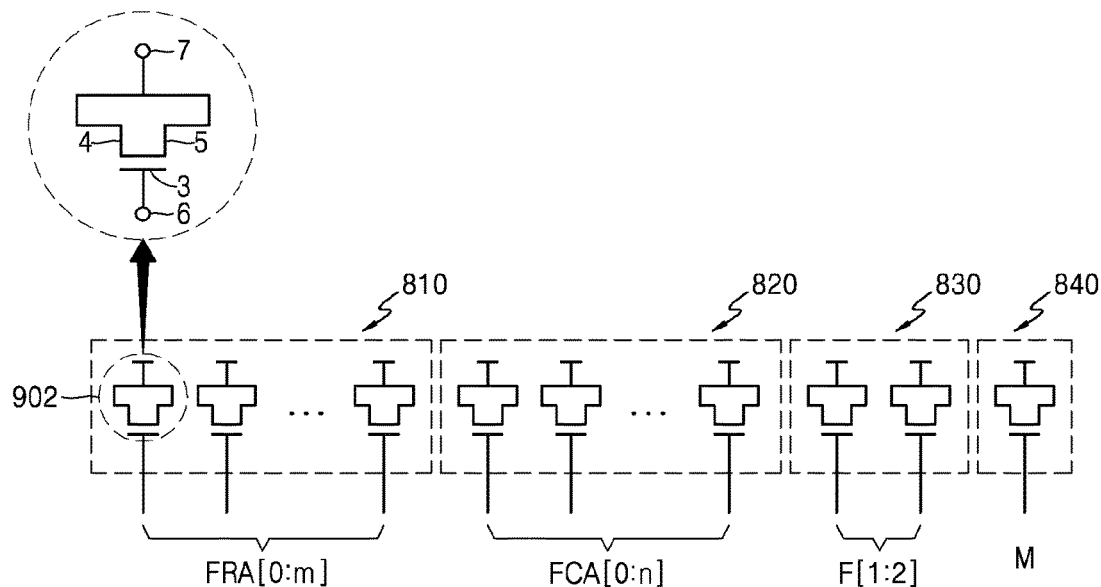

FIGS. 8 and 9 are diagrams for describing the storage unit 122 of FIG. 1.

Referring to FIG. 8, the storage unit 122 may include a row address storage unit 810, a column address storage unit 820, an ordering storage unit 830, and a master storage unit 840. The row address storage unit 810 stores row addresses FRA[0:m] of a fail cell, and the column address storage unit 820 may store column addresses FCA[0:n] of the fail cell. The ordering storage unit 830 may store, for example, ordering information F[1:2] described above with reference to FIG. 6B, and the master storage unit 840 may store master information M.

Referring to FIG. 9, the row address storage unit 810, the column address storage unit 820, the ordering storage unit 830, and the master storage unit 840 may be formed by an anti-fuse array including a plurality of anti-fuses 902. The anti-fuse 902 has an electric characteristic opposite to a fuse device, and is a resistance fuse device that has a high resistance value in an un-programmed state and has a low resistance value in a programmed state.

The anti-fuse 902 generally has a structure wherein a dielectric material is inserted between conductive materials, and is programmed by breaking down the dielectric material between the conductive materials by applying a high voltage to the dielectric material through the conductive materials. Then, the conductive materials of the anti-fuse 902 are short-circuited, and thus the anti-fuse 902 may have a low resistance value.

The anti-fuse 902 includes a depletion mode metal oxide semiconductor (MOS) transistor wherein a source electrode 4 and a drain electrode 5 are connected to each other. In an initial state, resistance between a first node 6 connected to a gate electrode 3 and a second node 7 commonly connected to the source and drain electrodes 4 and 5 may be very high since a space between the first and second nodes 6 and 7 is separated by a gate oxide film. Accordingly, the space between the first and second nodes 6 and 7 is non-conductive. Such a state may be set to, for example, logic 'low' that is the un-programmed state.

The anti-fuse 902 may apply a breakdown voltage between the first and second nodes 6 and 7 to break down the gate oxide film, so as to irreversibly change from a non-conductive state to a conductive state. When the gate oxide film breaks down, the resistance between the first and second nodes 6 and 7 may be decreased. Such a state may be set to logic 'high'; that is the programmed state.

The storage unit 122 may selectively program the anti-fuses 920 forming the row address storage unit 810, the column address storage unit 820, the ordering storage unit 830, and the master storage unit 840 to respectively store the row addresses FRA[0:m], the column addresses FCA[0:n], the ordering information F[1:2] and the master information M of fail cells generated while manufacturing the memory device 100 of FIG. 1.

Figure 10:
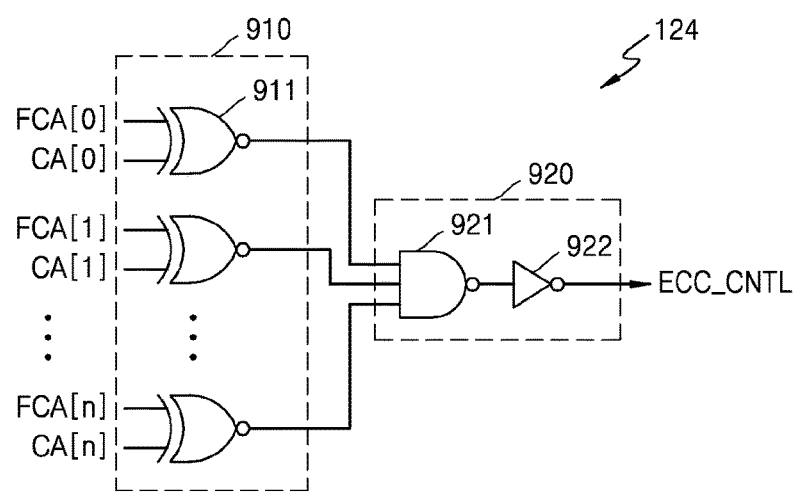
FIG. 10 is a diagram for describing a comparator of FIG. 1.

FIG. 10 is a diagram for describing the comparator 124 of FIG. 1.

Referring to FIG. 10, the comparator 124 may include an address comparator 910 and an ECC control single output unit 920. The address comparator 910 may include XNOR gates 911 that compare each of the column addresses FCA[0:n] output from the FCS cell array 114 of FIG. 1 and each of the access column addresses CA[0:n]. The ECC control signal output unit 920 may include a NAND gate 921 into which outputs of the XNOR gates 911 are input, and an inverter 922 into which an output of the NAND gate 921 is input. An output of the inverter 922 may be output as the ECC control signal ECC_CNTL.

Figure 11:
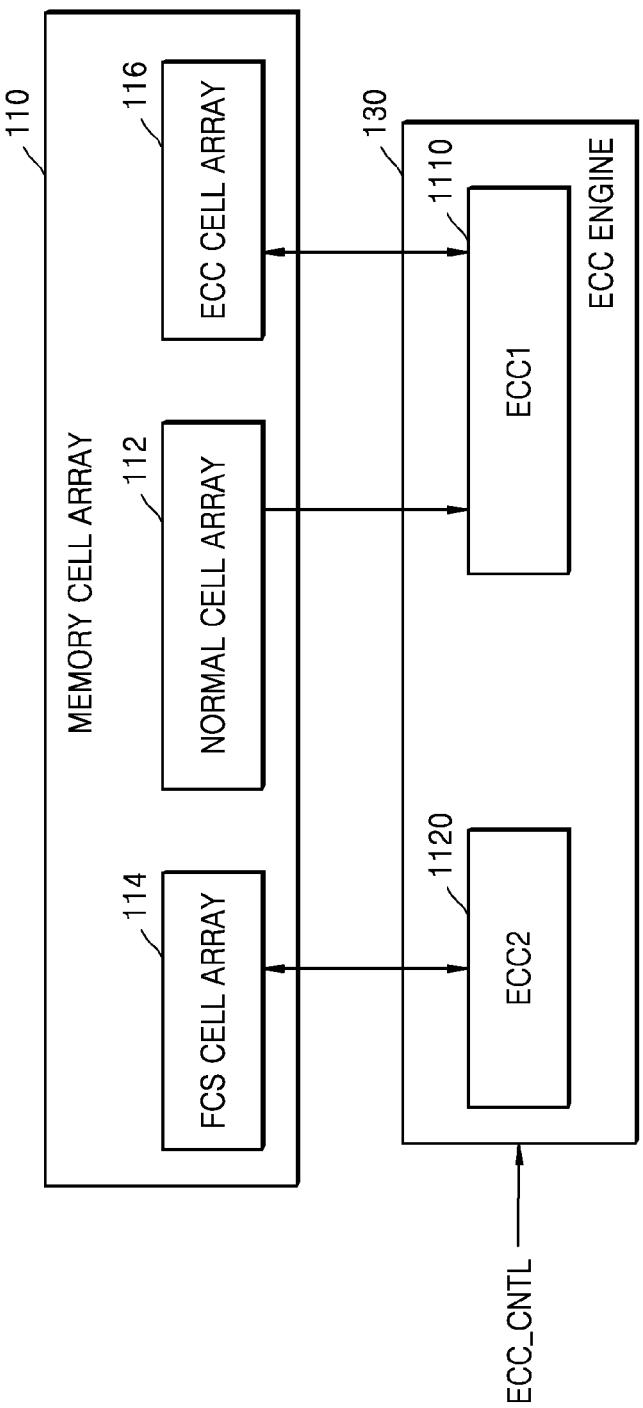
FIG. 11 is a diagram for describing an error correction code (ECC) engine of FIG. 1.

FIG. 11 is a diagram for describing the ECC engine 130 of FIG. 1.

Referring to FIG. 11, the ECC engine 130 may include a first ECC engine 1110 and a second ECC engine 1120. The first ECC engine 1110 may perform an ECC operation on a fail cell of the normal cell array 112 in response to the ECC control signal ECC_CNTL. The first ECC engine 1110 may generate parity bits with respect to write data bits written to the memory cells of the normal cell array 112, which include the fail cell, and store the generated parity bits in the ECC cell array 116. The first ECC engine 1110 may detect and correct an error bit included in read data bits read from the memory cells of the normal cell array 112, which include the fail cell, by using the read data bits and the parity bits read from the ECC cell array 116.

The second ECC engine 1120 may perform an ECC operation on the fail cell information stored in the FCS cell array 114, in response to the ECC control signal ECC_CTL. The second ECC engine 1120 may perform the ECC operation on the fail cell information stored in the FCS cell array 114 to generate parity bits, and store the generated parity bits in the FCS cell array 114. For example, as described above with reference to FIGS. 6A and 6B, the parity bits with respect to the fail cell information may be stored in the reserved 5 bits of the FCS1L cell block 407L. The second ECC engine 1120 may detect and correct an error bit included in the fail cell information read from the FCS cell array 114 by using the fail cell information and the parity bits.

Figure 12:
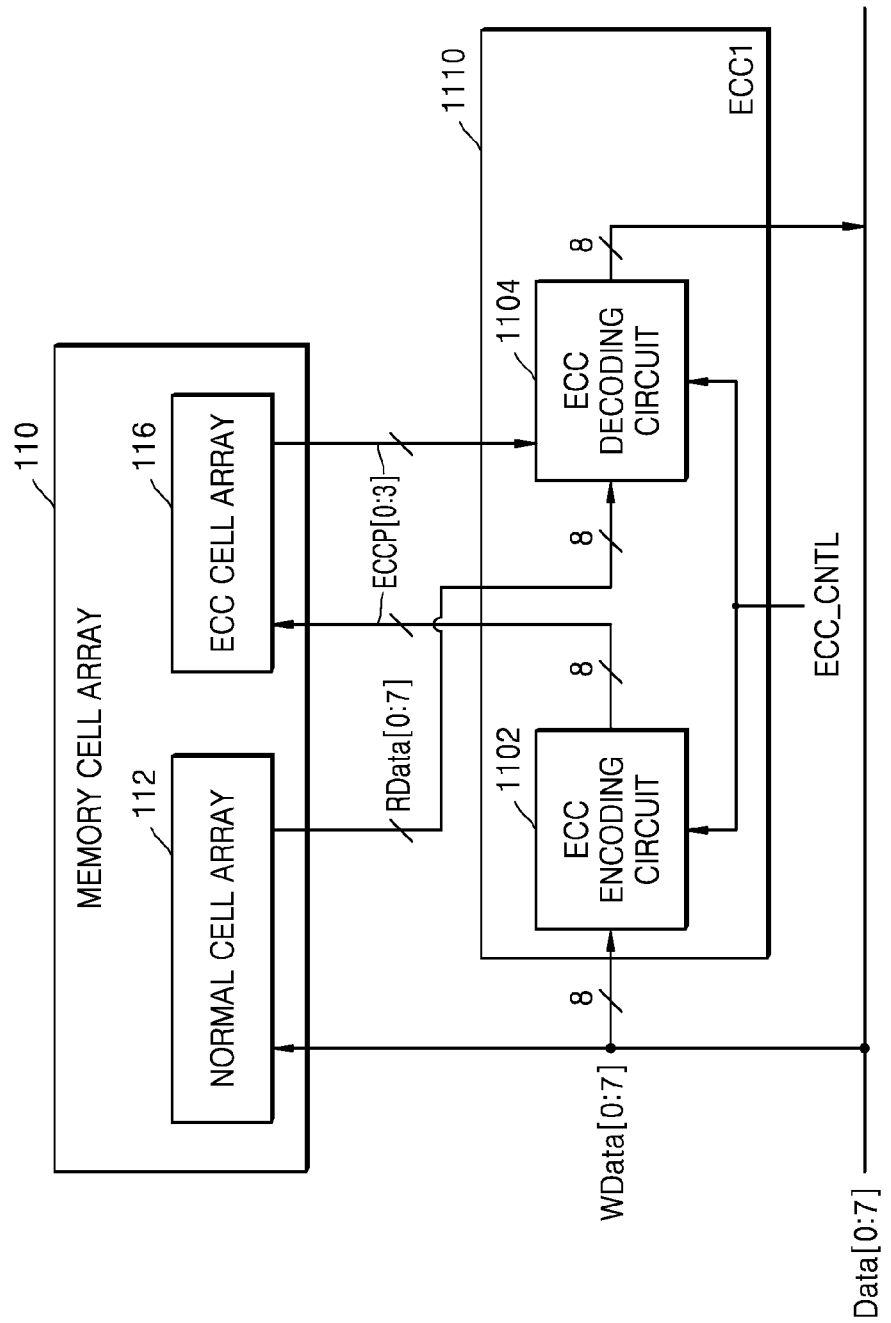
FIG. 12 is a diagram for describing a first ECC engine of FIG. 11.

FIG. 12 is a diagram for describing the first ECC engine 1110 of FIG. 11. The first ECC engine 1110 of FIG. 12 adaptively operates in the X4 mode of the memory device 100a of FIG. 4.

Referring to FIG. 12, the first ECC engine 1110 may include an ECC encoding circuit 1102 and an ECC decoding circuit 1104. The ECC encoding circuit 1102 may generate parity bits ECCP[0:3] with respect to write data WData[0:7] to be written to the memory cells of the memory cell array 110, in response to the ECC control signal ECC_CNTL. The parity bits ECCP[0:3] may be stored in the ECCPL cell block 405L or the ECCPU cell block 405U of the ECC cell array 116. The write data WData[0:7] may be stored in the DQ0L to DQ3L cell blocks 401L through 404L or the DQ0U to DQ3U cell blocks 401U through 404U of the normal cell array 112.

In response to the ECC control signal ECC_CNTL, the ECC decoding circuit 1104 may correct an error bit included in read data RData[0:7] read from the normal cell array 112 by using the read data RData[0:7] and the parity bits ECCP[0:3] read from the ECC cell array 116, and output data Data[0:7] with the corrected error bit.

Figure 13A:
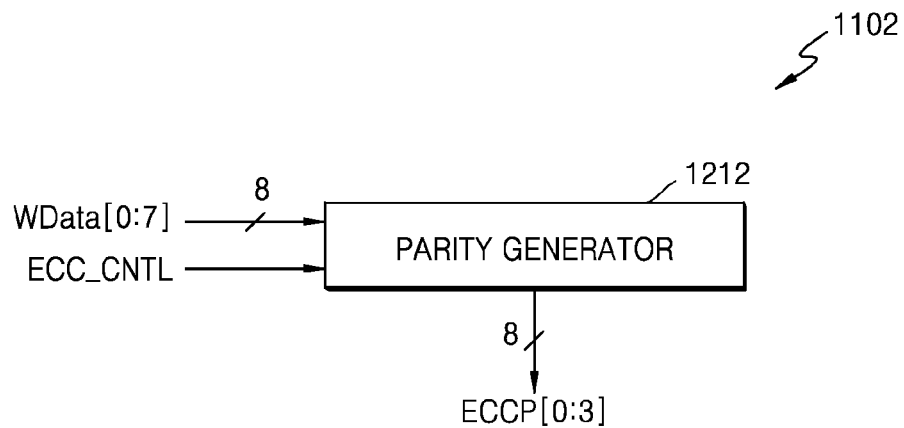
FIGS. 13A and 13B are diagrams for describing an ECC encoding circuit and an ECC decoding circuit of FIG. 12.
Figure 13B:
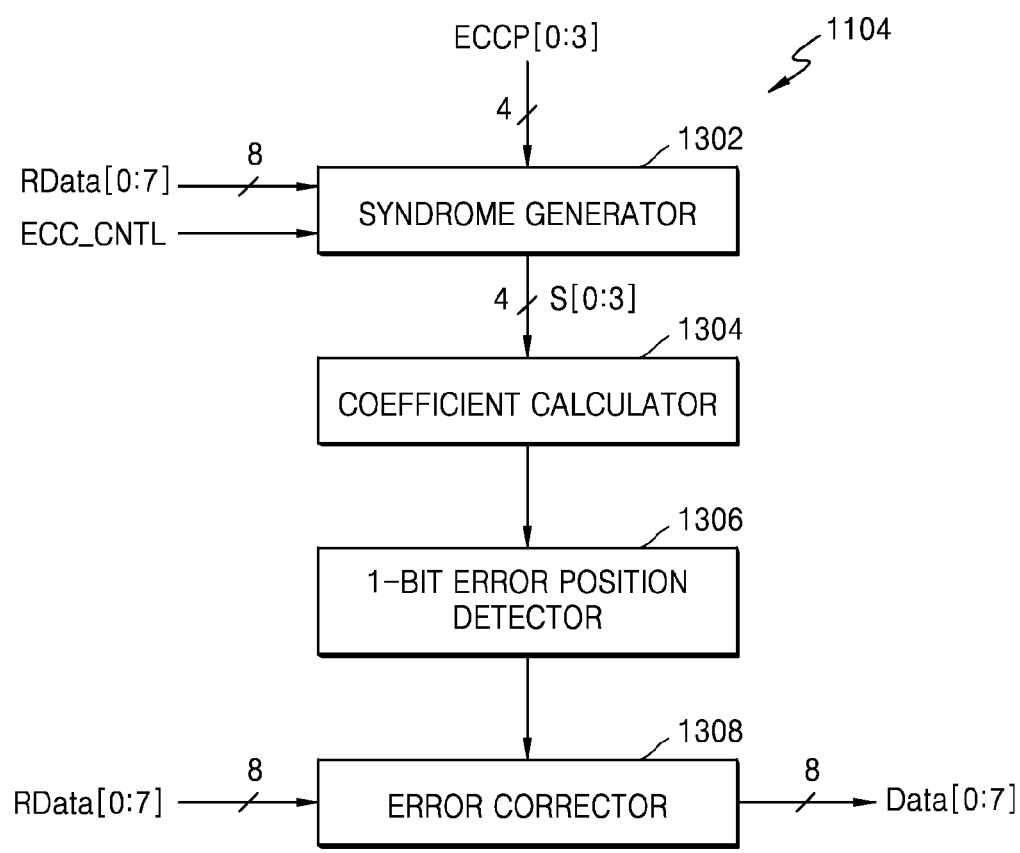

FIGS. 13A and 13B are diagrams for describing the ECC encoding circuit 1102 and the ECC decoding circuit 1104 of FIG. 12.

Referring to FIG. 13A, the ECC encoding circuit 1102 may include a parity generator 1212 that receives the write data WData[0:7] in 8 bits in response to the ECC control signal ECC_CNTL, and generates the parity bits ECCP[0:3] by using any well-known logical operation between data bits used to generate parity bits.

Referring to FIG. 13B, the ECC decoding circuit 1104 may include a syndrome generator 1302, a coefficient calculator 1304, a 1-bit error position detector 1306, and an error corrector 1308. The syndrome generator 1302 may receive the read data RData[0:7] in 8 bits and the parity bits ECCP[0:3] in 4 bits in response to the ECC control signal ECC_CNTL, and generate syndrome data S[0:3] by using an XOR array operation. The coefficient calculator 1304 may calculate a coefficient of an error position equation by using the syndrome data S[0:3]. The error position equation is an equation that uses a reciprocal of an error bit as a root. The 1-bit error position detector 1306 may calculate a position of a 1-bit error by using the calculated error position equation. The error corrector 1308 may correct an error by reversing a logic value of a bit having an error from among the read data RData[0:7] in 8 bits according to the determined position of the 1-bit error and output the data Data[0:7] in which the error is corrected.

Figure 14:
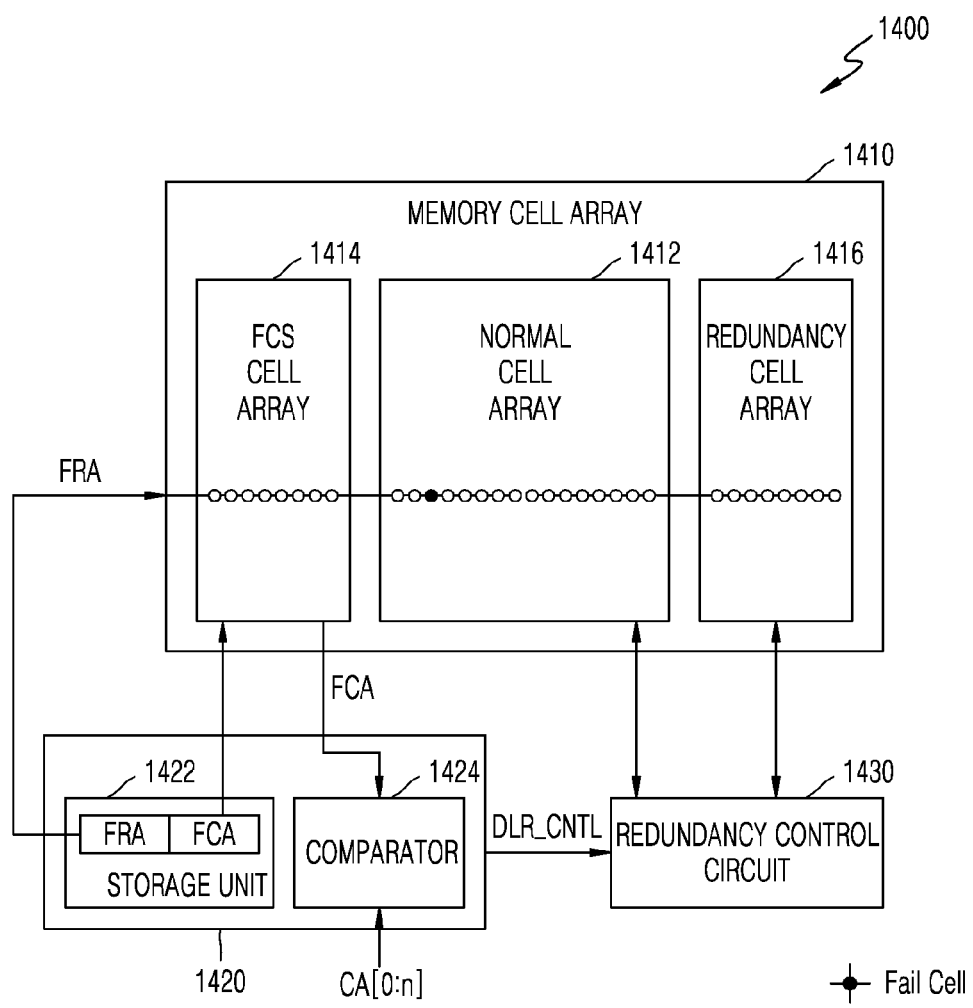
FIG. 14 is a diagram of a memory device capable of quickly repairing a fail cell, according to another embodiment of the inventive concepts.

FIG. 14 is a diagram of a memory device 1400 capable of quickly repairing a fail cell, according to another embodiment of the inventive concepts.

Referring to FIG. 14, the memory device 1400 performs a data line redundancy operation to repair a fail cell. The memory device 1400 may include a memory cell array 1410, a control logic unit 1420, and a redundancy control circuit 1430. The memory cell array 1410 may include a plurality of memory cells arranged in rows and columns. The memory cell array 1410 may include a normal cell array 1412, an FCS cell array 1414, and a redundancy cell array 1416. The control logic unit 1420 may store fail cell information about a fail cell generated in the normal cell array 1412. The redundancy control circuit 1430 may perform a repair operation by replacing a column connected to the fail cell of the normal cell array 1412 with a column of the redundancy cell array 1416.

A fail cell indicated by ● and addressed by the fail row address FRA and the fail column address FCA may exist in the normal cell array 1412. The FCS cell array 1414 may copy and store the fail cell information stored in a storage unit 1422 of the control logic unit 1420. The storage unit 1422 may store the fail row address FRA and the fail column address FCA of the fail cell generated in the normal cell array 1412. The FCS cell array 1414 may store the fail column address FCA in memory cells accessed by the fail row address FRA.

The FCS cell array 1414 may provide the fail column address FCA to a comparator 1424 of the control logic unit 1420. The comparator 1424 may compare the fail column address FCA output from the memory cells of the fail row address FRA of the FCS cell array 114 with an access address of a write or read operation of the memory device 1400.

The comparator 1424 may compare the access address with the fail row address FRA and the fail column address FCA output from the FCS call array 1414 to more quickly obtain a comparison result than when the access address is compared with the fail row address FRA and the fail column address FCA stored in the storage unit 1422. If the access address matches the fail row address FRA and the fail column address FCA, whether to perform a data line repair (DLR) operation, wherein memory cells of the FCS cell array 1414, which correspond to the fail column address FCA, are replaced with redundancy cells of the redundancy cell array 1416, may be quickly determined.

The redundancy cell array 1416 may be used to repair a column connected to the fail cell of the normal cell array 1412. The redundancy cell array 1416 may include redundancy cells for repairing a fail cell. In order to repair a fail cell, the redundancy cell array 1416 may use redundancy cells in units of a data line or bit line connected to the fail cell.

The control logic unit 1420 may determine whether an access address applied from an external source outside the memory device 1400 addresses the fail cell. The control logic unit 1420 may store the fail row address FRA or the fail column address FCA generated in the normal cell array 1412. The control logic unit 1420 compares the access address applied from the external source with the fail row address FRA and the fail column address FCA, and determine whether to perform a DLR operation based on a result of the comparison. The control logic unit 1420 may include the storage unit 1422 that stores the fail row address FRA and the fail column address FCA, and the comparator 1424 that compares the fail column address FCA output from the FCA cell array 1414 with the access column address CA[0:n].

The storage unit 1422 may store the fail row address FRA and the fail column address FCA for a fail cell in the normal cell array 1412. The fail row address FRA and the fail column address FCA may be obtained during a test process while manufacturing the memory device 1400. The fail row address FRA and the fail column address FCA may be stored in the storage unit 1422 when the memory device 1400 is shipped.

During initialization according to power-up of the memory device 1400, the storage unit 1422 may enable a word line of the memory cell array 1410, which corresponds to the fail row address FRA. The storage unit 1422 may store the fail column address FCA in memory cells of the FCS cell array 1414, which are connected to a word line of the fail row address FRA.

According to some embodiments, the storage unit 1422 may be a one-time programmable memory, such as a laser-programmable fuse array, an anti-fuse array, or an electric programmable fuse array, or may be a nonvolatile memory device, such as MRAM, RRAM, PRAM, or a flash memory.

The comparator 1424 may receive the access column address CA[0:n], and receive the fail column address FCA from the FCS cell array 1414. If the access column address CA[0:n] and the fail column address FCA match each other, the comparator 1424 may output a DLR control signal DLR_CNTL. The DLR control signal DLR_CNTL may be provided to the redundancy control circuit 1430 such that a column of the normal cell array 1412, which corresponds to the fail column address FCA, is replaced with a column of the redundancy cell array 1416.

In response to the DLR control signal DLR_CNTL, the redundancy control circuit 1430 may replace the column of the normal cell array 1412, which corresponds to the fail column address FCA, with the column of the redundancy cell array 1416. The redundancy control circuit 1430 may replace the column corresponding to the fail column address FCA with the column of the redundancy cell array 1416 in units of a data line or bit line.

FIG. 15 is a flowchart of a method of operating the memory device 1400 of FIG. 14.

Referring to FIG. 15 and FIG. 14, the memory cells of the memory cell array 1410 may be determined to be good or bad during a test process of the memory device 1400. The memory device 1400 may store the fail cell information, i.e., the fail row address FRA and the fail column address FCA of the fail cell screened during the test process, in the storage unit 1422, in operation S1510.

The memory device 1400 may perform initialization according to power-up when power is supplied. The memory device 1400 may copy and store the fail cell information stored in the storage unit 1422, in the FCS cell array 1414 of the memory cell array 1410, during the initialization, in operation S1520. The memory device 1400 may enable a word line of the memory cell array 1410, which corresponds to the fail row address FRA of the storage unit 1422, and may store the fail column address FCA of the storage unit 1422 in the memory cells of the FCA cell array 1414, which are connected to the word line of the fail row address FRA. The FCS cell array 1414 will periodic refresh the data stored therein in operation S1525. While shown sequentially in the flow chart of FIG. 15, it will be understood that the refresh operation is a separate periodic operation.

The memory device 1400 may receive the access address together with a write or read command from a memory controller or a memory buffer, in operation S1530.

The memory device 1400 may determine whether the access address matches a fail address of the FCS cell array 1414, in operation S1540.

If it is determined that an access row address matches the fail row address FRA of the fail cell in operation S1540, a word line of the memory cell array 1410, which corresponds to the fail row address FRA, may be enabled. The fail column address FCA stored in the memory cells of the FCS cell array 1414, which are connected to the word line of the fail row address FRA, may be read and provided to the comparator 1424. The comparator 1424 may compare and determine whether the fail column address FCA and the access column address CA[0:n] match each other.

If it is determined that the fail column address FCA and the access column address CA[0:n] match each other in operation S1540, the memory device 1400 may perform the access operation with the DLR operation in operation S1550 by replacing the column of the FCS cell array 1414, which corresponds to the fail column address FCA, with the column of the redundancy cell array 1416.

If the access column address CA[0:n] and the fail column address FCA match each other, the comparator 1424 may generate and provide the DLR control signal DLR_CNTL to the redundancy control circuit 1430. In response to the DLR control signal DLR_CNTL, the redundancy control circuit 1430 may replace the column corresponding to the fail column address FCA with the column of the redundancy cell array 1416 in units of a data line or bit line.

The memory device 1400 may perform a write or read operation on memory cells of the redundancy cell array 1416, which corresponds to the access address that is repaired via the DLR operation.

If it is determined that the fail column address FCA and the access column address CA[0:n] do not match each other in operation S1540, the memory device 1400 may perform a write or read operation on memory cells of the normal cell array 1412, which corresponds to the access address, without the DLR operation in operation S1560.

According to the method of the current embodiment, the fail row address FRA and the fail column address FCA stored in the storage unit 1422 may be copied and stored in the FCS cell array 1414 during the initialization of the memory device 1400. The fail row address FRA and the fail column address FCA stored in the FCS cell array 1414 may be compared with the access address for performing the write or read operation of the memory device 1400, and whether to perform the DLR operation on the memory cells corresponding to the access address may be determined based on a result of the comparison.

According to the method, the comparison result may be quickly obtained since only the access column address of the access address is compared with the fail column address FCA, and the access row address of the access address is not used. Also, since the access column address is compared with the fail column address FCA output from the FCS cell array 1414, the comparison result may be obtained quicker than when the access column address is compared with the fail row address FRA and the fail column address FCA of the storage unit 1422. Based on such a comparison result, the fail cell addressed by the fail row address FRA and the fail column address FCA may be repaired via the DLR operation performed in the units of a data line or bit line.

Figure 16A:
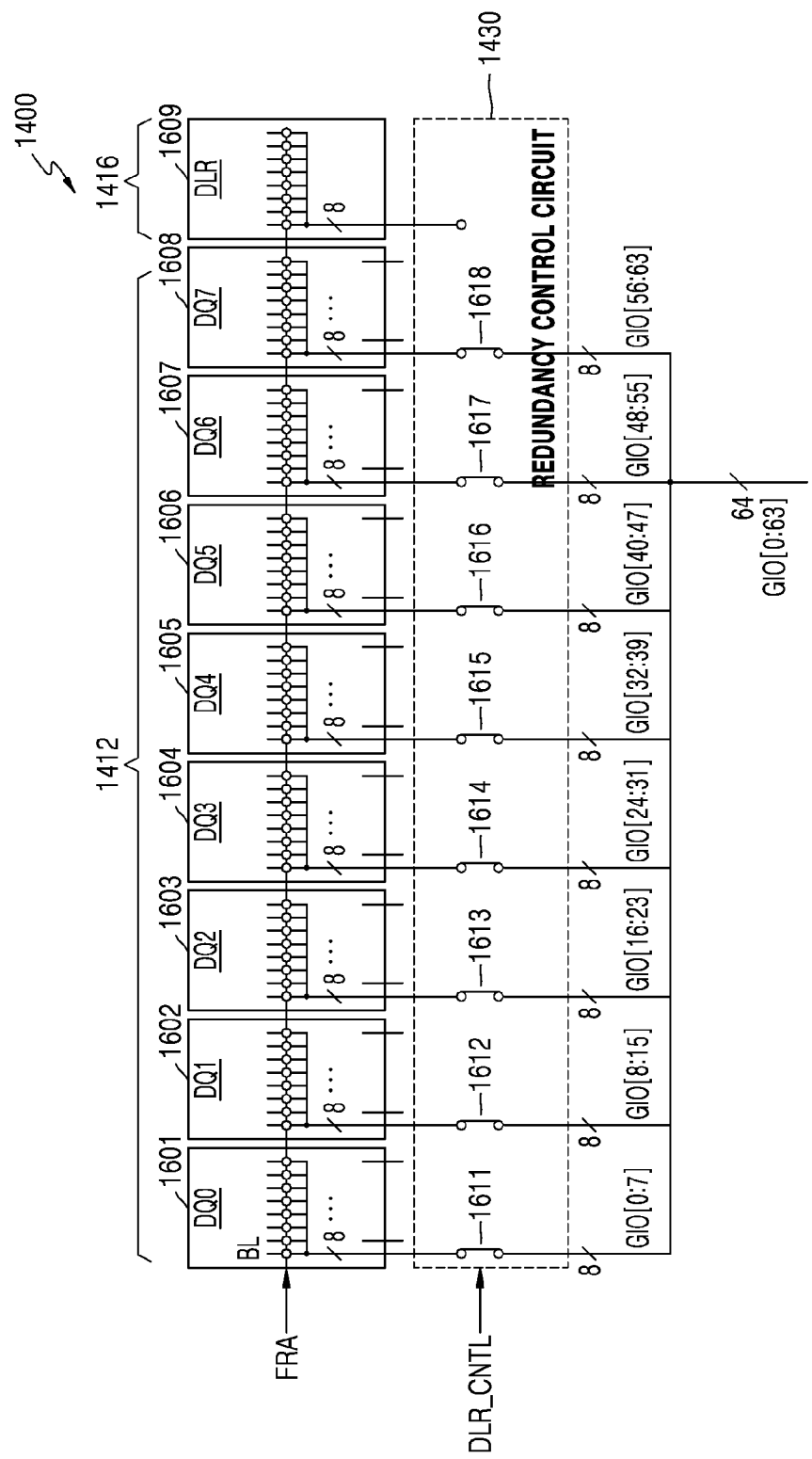
FIGS. 16A and 16B are diagrams for describing a data line repair (DLR) operation performed in units of a data line of the memory device of FIG. 14.
Figure 16B:
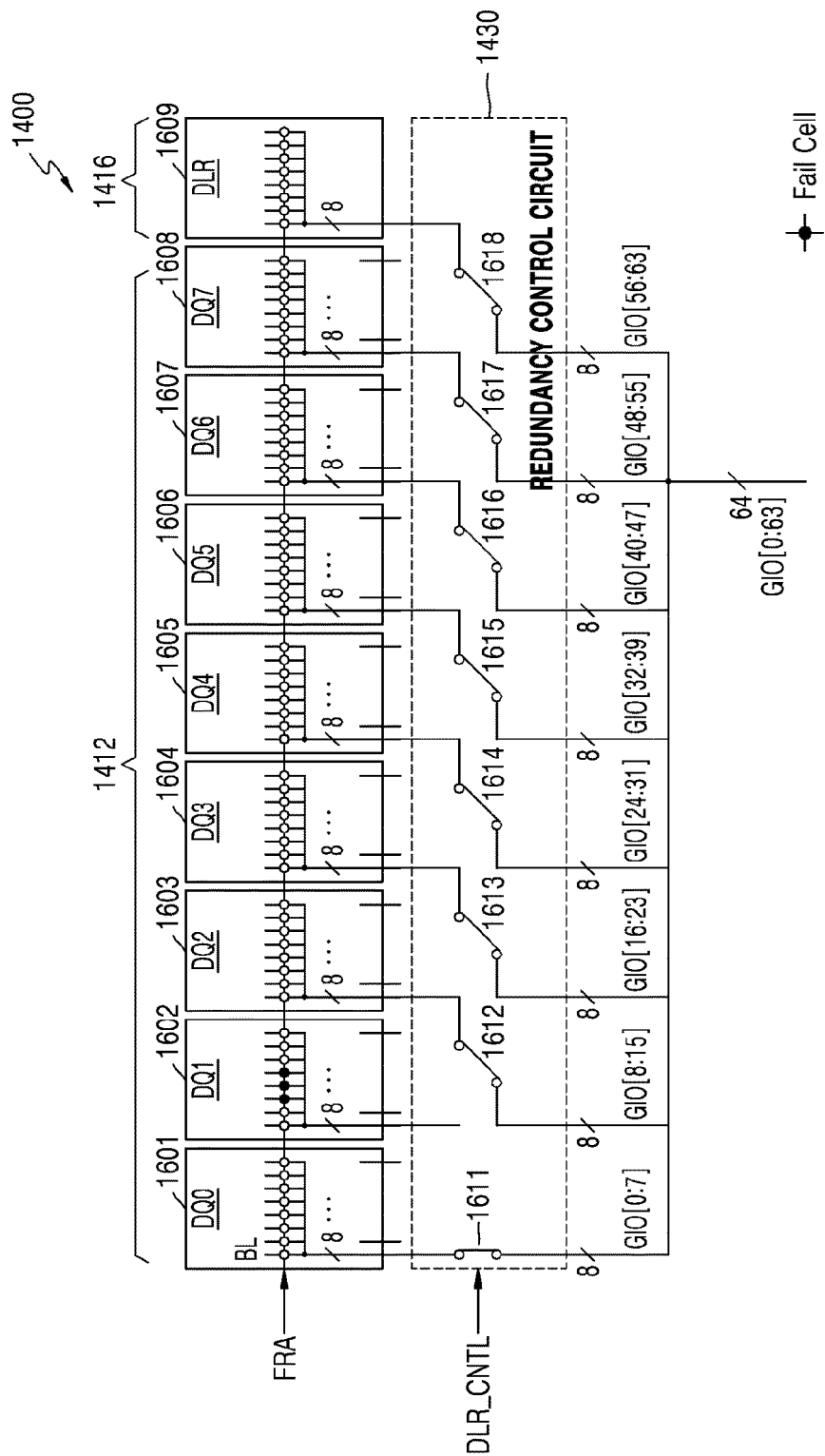

FIGS. 16A and 16B are diagrams for describing the DLR operation performed in units of a data line of the memory device 1400 of FIG. 14. FIGS. 16A and 16B show the memory device 1400 respectively before and after data lines in 8 bits of the DQ0 to DQ7 cell blocks 1601 through 1608 are repaired to data lines in 8 bits of a DLR cell block 1609.

Referring to FIG. 16A, the normal cell array 1412 may include a plurality of normal cell blocks. Each of the normal cell blocks includes a plurality of memory cells arranged in rows and columns. Since data stored in the memory cells of the normal cell blocks is input or output through the data IO pads DQ0 through DQ7, respectively, for convenience of description, the normal cell blocks will now be referred to as the DQ0 to DQ7 cell blocks 1601 through 1608.

In each of the DQ0 to DQ7 cell blocks 1601 through 1608, rows may include, for example, 8K word lines WL and columns may include, for example, 1K bit lines BL. Memory cells connected to intersections of the word lines WL and the bit lines BL may be DRAM cells indicated by ○. The memory device 1400 may be set to have a burst length of 8. Accordingly, 8 bit lines BL may be simultaneously selected in the DQ0 to DQ7 cell blocks 1601 through 1608.

In order to repair the column connected to the fail cell of the normal cell array 1412, the redundancy cell array 1416 may include, for example, 8K word lines WL, like the DQ0 to DQ7 cell blocks 1601 through 1608. The redundancy cell array 1416 may include 8 bit lines BL, unlike the DQ0 to DQ7 cell blocks 1601 through 1608. The redundancy cell array 1416 may include the DLR cell block 1609 that includes DRAM cells connected to intersections of the 8K word lines WL and the 8 bit lines BL.

The redundancy control circuit 1430 may include first through eighth switching units 1611 through 1618 that respectively connect the DQ0 to DQ7 cell blocks 1601 through 1608 and the first through eighth data lines GIO[0:63], in response to the DLR control signal DLR_CNTL. If the fail column address FCA output from the FCS cell array 1414 of FIG. 14 and the access column address CA[0:n] do not match each other, the redundancy control circuit 1430 may receive the DLR control signal DLR_CNTL in a deactivated state.

The redundancy control circuit 1430 may connect the DQ0 cell block 1601 and the first data lines GIO[0:7] through the first switching unit 1611, in response to the DLR control signal DLR_CNTL in the deactivated state. Also, the DQ1 cell block 1602 and the second data lines GIO[8:15] may be connected to each other through the second switching unit 1612, and the DQ3 through DQ8 cell blocks 1603 through 1608 and the third through eighth data lines GIO[16:23] through GIO[56:63] may be connected to each other through the third through eighth switching units 1613 through 1618, respectively.

When there is a fail cell (indicated by ●) in the DQ0 to DQ7 cell blocks 1601 through 1608, the redundancy control circuit 1430 may receive the DLR control signal DLR_CNTL in an activated state. For example, as shown in FIG. 16B, a plurality of fail cells may exist in the DQ1 cell block 1602.

Referring to FIG. 16B, if the fail column address FCA output from the FCS cell array 1414 of FIG. 14 and the access column address CA[0:n] match each other, the redundancy control circuit 1430 may receive the DLR control signal DLR_CNTL in the activated state. The redundancy control circuit 1430 may connect the DQ0 cell block 1601 and the first data lines GIO[0:7] to each other through the first switching unit 1611, in response to the DLR control signal DLR_CNTL in the activated state. The redundancy control circuit 1430 may control the second switching unit 1612 such that the DQ1 cell block 1602 including the fail cell and the second data lines GIO[8:15] are not connected to each other and the DQ2 cell block 1603 and the second data lines GIO[8:15] are connected to each other, in response to the DLR control signal DLR_CNTL in the activated state.

The redundancy control circuit 1430 may connect the DQ3 cell block 1604 and the third data lines GIO[16:23] to each other through the third switching unit 1613, connect the DQ4 cell block 1605 and the fourth data lines GIO[24:31] to each other through the fourth switching unit 1614, and connect the DQ5 to DQ7 cell blocks 1606 through 1608 and the fifth through seventh data lines GIO[32:39] through GIO[48:55] to each other through the fifth through seventh switching units 1615 through 1617, respectively, in response to the DLR control signal DLR_CNTL in the activated state. Also, the redundancy control circuit 1430 may connect the DLR cell block 1609 and the eighth data lines GIO[56:63] to each other through the eighth switching unit 1618, in response to the DLR control signal DLR_CNTL in the activated state.

The memory device 1400 according to the current embodiment performs the DLR operation in units of a data line in 8 bits. According to some embodiments, the DLR operation may be performed in units of a data line in any number of bits, as well as in 8 bits.

Figure 17A:
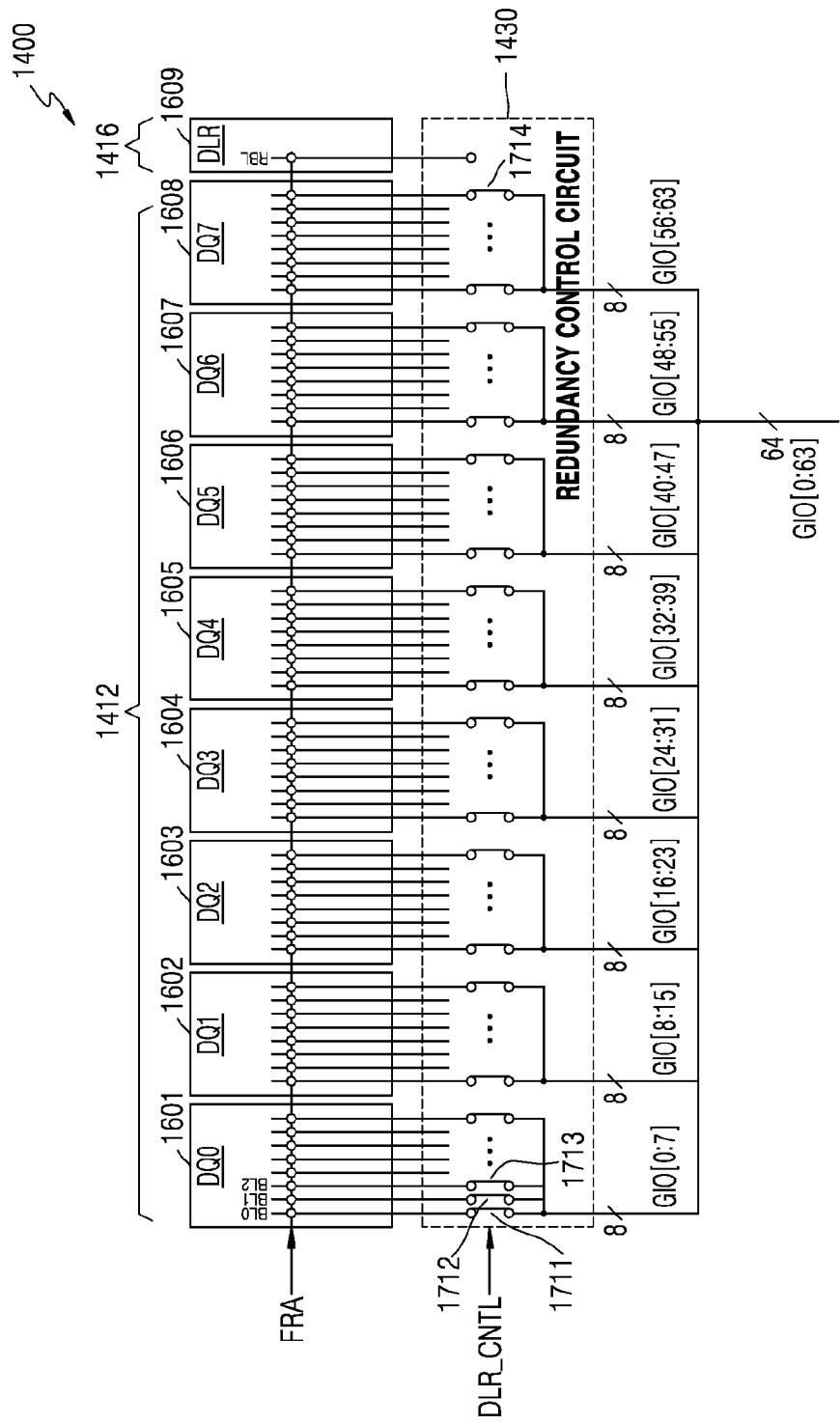
FIGS. 17A and 17B are diagrams for describing a DLR operation in units of a bit line of the memory device of FIG. 14.
Figure 17B:
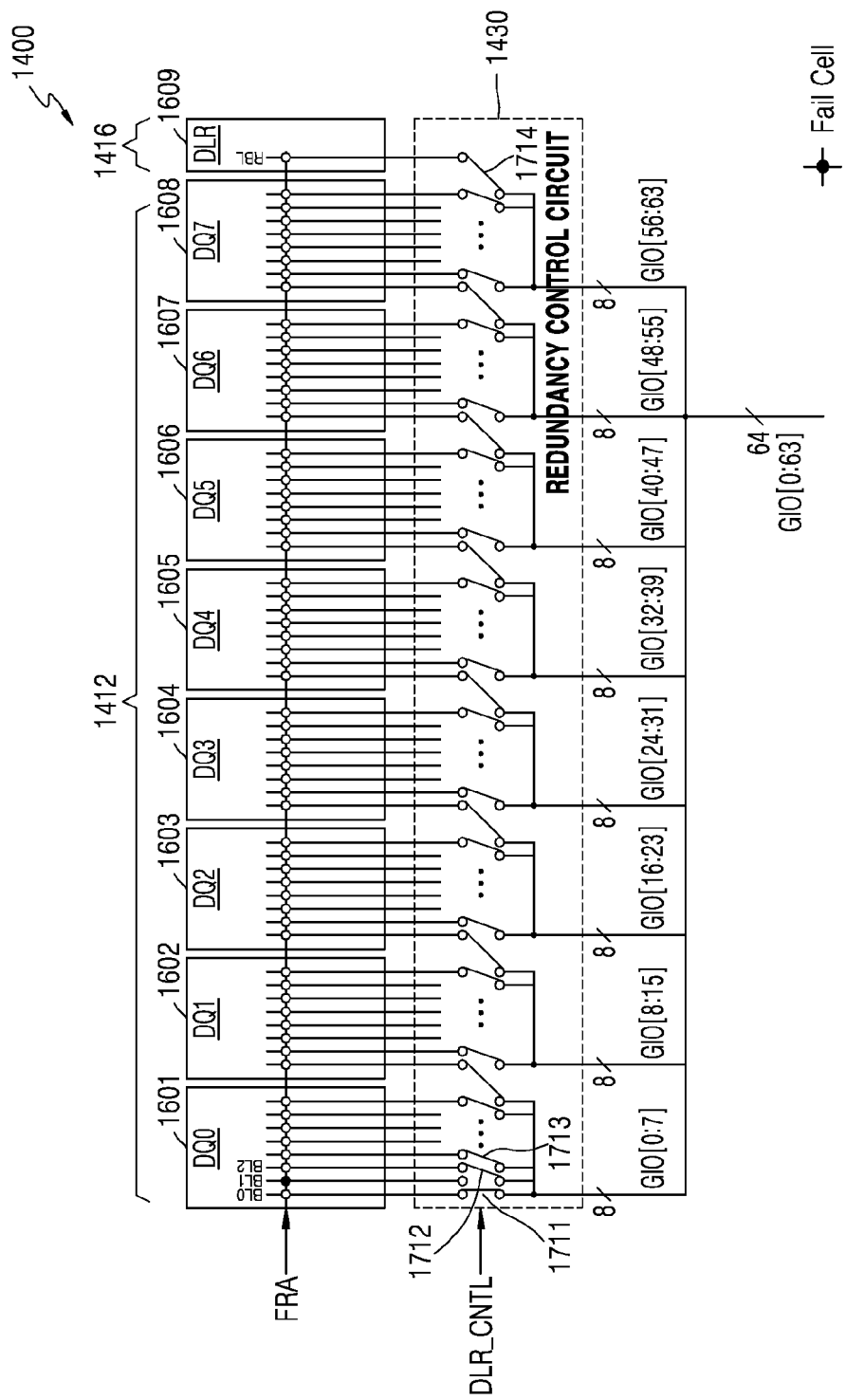

FIGS. 17A and 17B are diagrams for describing the DLR operation in units of a bit line of the memory device 1400 of FIG. 14. FIGS. 17A and 17B show the memory device 1400 respectively before and after one bit line of the DQ0 to DQ7 cell blocks 1601 through 1608 is repaired by one bit line of the DLR cell block 1609.

Referring to FIG. 17A, the redundancy control circuit 1430 may include a plurality of first through fourth switches 1711 through 1714 that connect bit lines of the DQ0 to DQ7 cell blocks 1601 through 1608 to the first through eighth data lines GIO[0:63], respectively, in response to the DLR control signal DLR_CNTL. If the fail column address FCA output from the FCS cell array 1414 of FIG. 14 and the access column address CA[0:n] do not match each other, the redundancy control circuit 1430 may receive the DLR control signal DLR_CNTL in the deactivated state.

In response to the DLR control signal DLR_CNTL in the deactivated state, the redundancy control circuit 1430 may connect a bit line BL0 of the DQ0 cell block 1601 and the data line GIO[0] to each other through the first switch 1711. Also, a bit line BL1 of the DQ0 cell block 1601 and the data line GIO[1] may be connected to each other through the second switch 1712, and a bit line BL2 of the DQ0 cell block 1601 and the data line GIO[2] may be connected to each other through the third switch 1713. Then, bit lines of the DQ0 to DQ7 cell blocks 1601 through 1608 and the data lines GIO[3] through GIO[62] may be connected to each other through remaining switches, respectively, and a bit line of the DQ7 cell block 1608 and the data line GIO[63] may be connected to each other through the fourth switch 1714.

When there is a fail cell (indicated by ●) in the DQ0 to DQ7 cell blocks 1601 through 1608, the redundancy control circuit 1430 may receive the DLR control signal DLR_CNTL in the activated state. For example, the fail cell may exist in the DQ0 cell block 1601 as shown in FIG. 17B.

Referring to FIG. 17B, if the fail column address FCA output from the FCS cell array 1414 of FIG. 14 and the access column address CA[0:n] match each other, the redundancy control circuit 1430 may receive the DLR control signal DLR_CNTL in the activated state. In response to the DLR control signal DLR_CNTL in the activated state, the redundancy control circuit 1430 may connect the bit line BL0 of the DQ0 cell block 1601 and the data line GIO[0] to each other through the first switch 1711.

In response to the DLR control signal DLR_CNTL in the activated state, the redundancy control circuit 1430 may control the second switch 1712 such that the bit line BL1 connected to the fail cell of the DQ0 cell block 1601 is not connected to the data line GIO[1] and the bit line BL2 adjacent to the bit line BL1 is connected to the data line GIO[1]. Also, in response to the DLR control signal DLR_CNTL in the activated state, the redundancy control circuit 1430 may connect the bit line BL3 of the DQ0 cell block 1601 and the data line GIO[2] to each other through the third switch 1713.

In response to the DLR control signal DLR_CNTL in the activated state, the redundancy control circuit 1430 may control the first through fourth switches 1711 through 1714 such that bitline, shifted by one bitline as compared to FIG. 17A, and a data line are connected to each other after skipping a bit line of one fail cell in a symmetrical bit line-data line connection structure. Accordingly, the redundancy control circuit 1430 may control the fourth switch 1714 such that the data line GIO[63] is connected to a redundant bit line RBL of the DLR cell block 1609.

Figure 18:
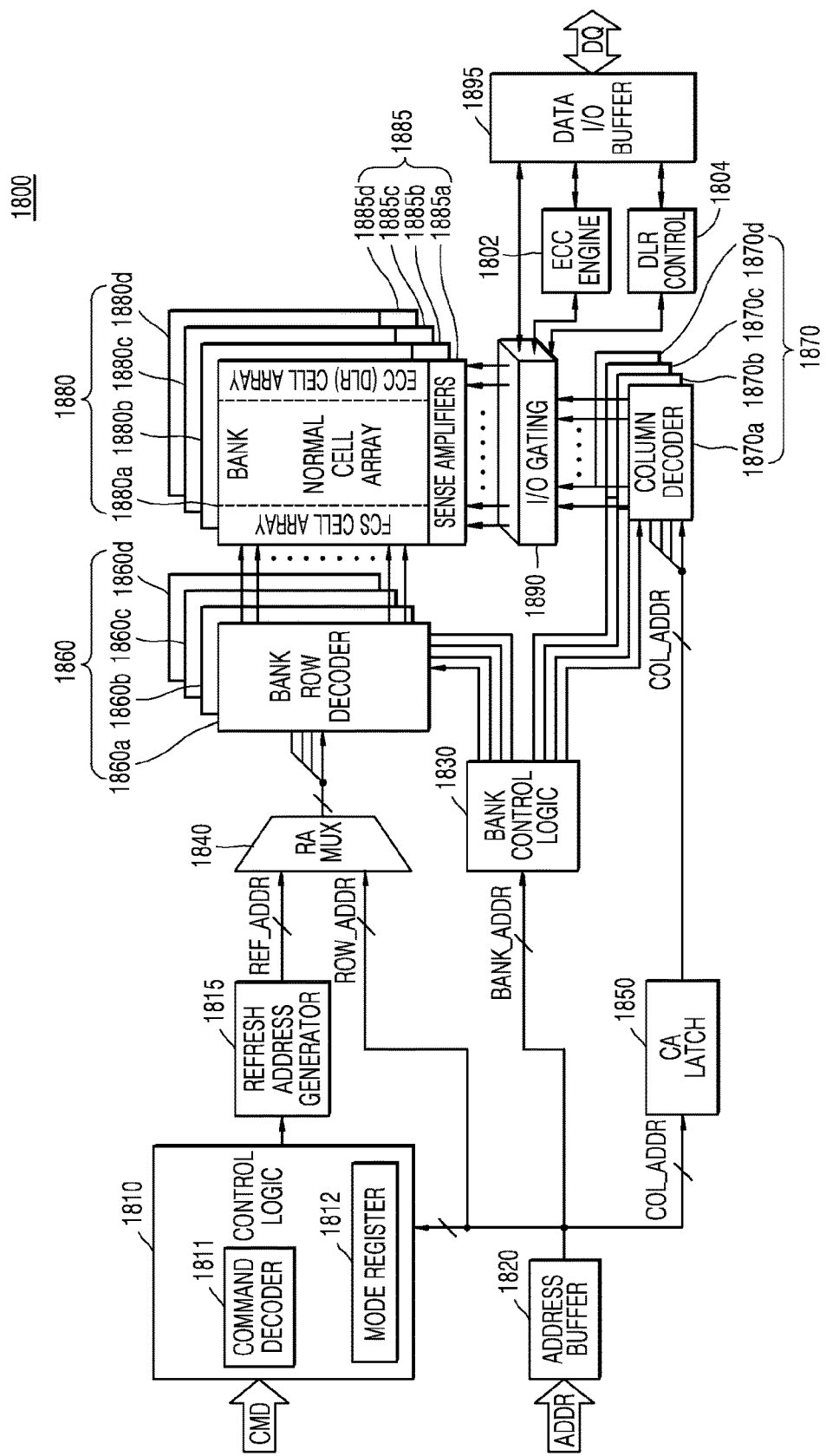
FIG. 18 is a diagram of a memory device capable of quickly repairing a fail cell, according to another embodiment of the inventive concepts.

FIG. 18 is a diagram of a memory device 1800 capable of quickly repairing a fail cell, according to another embodiment of the inventive concepts.

Referring to FIG. 18, the memory device 1800 may include a control logic 1810, a refresh address generator 1815, an address buffer 1820, a bank control logic 1830, a row address multiplexer 1840, a column address latch 1850, a row decoder 1860 (e.g., 1860a-1860d), a column decoder 1870 (e.g., 1870a-1870d), a memory cell array 1880 (e.g., 1880a-1880d), a sense amplifier 1885 (e.g., 1885a-1885d), an input/output (I/O) gating circuit 1890, a data I/O buffer 1895, an ECC engine 1802, and a DLR controller 1804. The memory device 1800 may selectively include one of the ECC engine 1802 and the DLR controller 1804 or both.

The memory cell region 1880 may include first through fourth bank arrays 1880a through 1880d. Each of the first through fourth bank arrays 1880a through 1880d may include a normal cell array, an FCS cell array, an ECC cell array, and a DLR cell array. The normal cell array, the FCS cell array, the ECC cell array, and the DLR cell array may each include a plurality of memory cells arranged in rows and columns.

The FCS cell array may copy and store fail cell information from a storage unit of the control logic 1810. The ECC cell array may store ECC parity bits used for an ECC operation performed on data provided to or from fail cells of the normal cell array. The DLR cell array may include redundant cells for repairing the fail cells of the normal cell array via a DLR operation.

The row decoder 1860 may include first through fourth bank row decoders 1860a through 1860d respectively connected to the first through fourth bank arrays 1880a through 1880d. The column decoder 1870 may include first through fourth bank column decoders 1870a through 1870d respectively connected to the first through fourth bank arrays 1880a through 1880d. The sense amplifier 1885 may include first through fourth bank sense amplifiers 1885a through 1885d respectively connected to the first through fourth bank arrays 1880a through 1880d.

The first through fourth bank arrays 1880a through 1880d, the first through fourth bank row decoders 1860a through 1860d, the first through fourth bank column decoders 1870a through 1870d, and the first through fourth bank sense amplifiers 1885a through 1885d may form first through fourth memory banks, respectively. In FIG. 18, the memory device 1800 includes four memory banks, but according to some embodiments, the memory device 1800 may include an arbitrary number of memory banks.

Also, according to some embodiments, the memory device 1800 may be DRAM, such as double data rate synchronous DRAM (DDR SDRAM), low power double data rate (LPDDR) SDRAM, graphic double data rate (GDDR) SDRAM, or Rambus DRAM (RDRAM), or an arbitrary volatile memory device that requires an ECC operation.

The control logic 1810 may control operations of the memory device 1800. For example, the control logic 1810 may generate control signals such that the memory device 1800 performs a write operation or a read operation. The control logic 1810 may store fail cell information including a fail cell address of a fail cell generated in the normal cell array, and compare the fail cell address output from the FCS cell array and an access address applied from an external source outside the memory device 1800. Based on a result of the comparison, the control logic 1810 may generate an ECC control signal and provide the ECC control signal to the ECC engine 1802 to perform an ECC operation. Alternatively, based on the comparison result, the control logic 1810 may generate a DLR control signal and provide the DLR control signal to the DLR controller 1804 to perform a DLR operation. In one embodiment, one of the reserved bits (see FIGS. 6A and 6B) may be used to indicate whether to perform the ECC operation or the DLR operation. For example, during the testing phase of manufacture if a wordline (e.g., row) includes too many errors to be corrected by ECC, then this mode selection bit in the reserved bits is set to indicate the DLR mode, otherwise, the mode selection bit in the reserved bits is set to indicated the ECC mode. The control logic may send signals (not shown) to the ECC engine 180 and the DLR controller 1804 to respectively activate and deactivate the ECC engine 180 and the DLR controller 1804.

The control logic 1810 may include a command decoder 1811 that decodes a command CMD received from a memory controller, and a mode register 1812 that sets an operation mode of the memory device 1800. The command decoder 1811 may generate control signals corresponding to the command CMD by decoding a write enable signal/WE, a row address strobe signal/RAS, a column address strobe signal/CAS, or a chip select signal/CS. The command decoder 1811 may receive an error count command ERR CNT from the memory controller.

The mode register 1812 may provide a plurality of operation options of the memory device 1800 and program various functions, characteristics, and modes of the memory device 1800. For example, The control logic 1810 may further receive differential clocks CK_t and CK_c and a clock enable signal CKE for driving the memory device 1800 in a synchronization manner. Data of the memory device 1800 may be operated at a double data rate. The clock enable signal CKE may be captured at a rising edge of the differential clock CK_t.

The control logic 1810 may control the refresh address generator 1815 to perform an auto-refresh operation in response to a refresh command, or to perform a self-refresh operation in response to a self-refresh enter command.

The refresh address generator 1815 may generate a refresh address REF_ADDR corresponding to a memory cell row on which a refresh operation is to be performed. The refresh address generator 1815 may generate the refresh address REF_ADDR in a refresh cycle defined by the standards of volatile memory devices.

The address buffer 1820 may receive an address ADDR including a bank address BANK_ADDR, a row address ROW_ADDR, and a column address COL_ADDR from the memory controller. Also, the address buffer 1820 may provide the received bank address BANK_ADDR to the bank control logic 1830, provide the received row address ROW_ADDR to the row address multiplexer 1840, and provide the received column address COL_ADDR to the column address latch 1850.

The bank control logic 1830 may generate bank control signals in response to the bank address BANK_ADDR. In response to the bank control signals, a bank row decoder corresponding to the bank address BANK_ADDR from among the first through fourth bank row decoders 1860a through 1860d may be activated, and a bank column decoder corresponding to the bank address BANK_ADDR from among the first through fourth bank column decoders 1870a through 1870d may be activated.

The bank control logic 1830 may generate bank group control signals in response to the bank address BANK_ADDR for determining a bank group. In response to the bank group control signals, row decoders of a bank group corresponding to the bank address BANK_ADDR from among the first through fourth bank row decoders 1860a through 1860d may be activated, and column decoders of the bank group corresponding to the bank address BANK_ADDR from among the first through fourth bank column decoders 1870a through 1870d may be activated.

The row address multiplexer 1840 may receive the row address ROW_ADDR from the address buffer 1820 and the refresh address REF_ADDR from the refresh address generator 1815. The row address multiplexer 1840 may selectively output the row address ROW_ADDR or the refresh address REF_ADDR. The row address ROW_ADDR output from the row address multiplexer 1840 may be applied to each of the first through fourth bank row decoders 1060a through 1060d.

The bank row decoder activated by the bank control logic 1830 from among the first through fourth bank row decoders 1860a through 1860d may decode the row address ROW_ADDR output by the row address multiplexer 1840 and activate a word line corresponding to the row address ROW_ADDR. For example, the activated bank row decoder may apply a word line driving voltage to the word line corresponding to the row address ROW_ADDR.

The column address latch 1850 may receive the column address COL_ADDR from the address buffer 1820 and temporarily store the received column address COL_ADDR. The column address latch 1850 may gradually increase the column address COL_ADDR in a burst mode. The column address latch 1850 may apply the column address COL_ADDR that is temporarily stored or gradually increased to each of the first through fourth bank column decoders 1870a through 1870d.

The bank column decoder activated by the bank control logic 1830 from among the first through fourth bank column decoders 1870a through 1870d may activate a sense amplifier corresponding to the bank address BANK_ADDR and the column address COL_ADDR through the I/O gating circuit 1890.

The I/O gating circuit 1890 may include, together with circuits for gating I/O data, an input data mask logic, read data latches for storing data output from the first through fourth bank arrays 1880a through 1880d, and write drivers for writing data to the first through fourth bank arrays 1880a through 1880d.

Data for writing to a memory cell array of one of the first through fourth bank arrays 1880a through 1880d may be provided from the memory controller to the data I/O buffer 1895 through the memory buffer. The data provided to the data I/O buffer 1895 may be written to one bank array through a write buffer. The data provided to the data I/O buffer 1895 may be transmitted to the ECC engine 1802. The ECC engine 1802 may generate parity bits with respect to data to be written to the normal cell array. The parity bits generated by the ECC engine 1802 may be stored in the ECC cell array of the bank array.

Data read from the normal cell array of one of the first through fourth bank arrays 1880a through 1880d and parity bits read from the ECC cell array may be sensed and amplified by the sense amplifier, and stored in the read data latches. The data stored in the read data latches may be transmitted to the data I/O buffer 1895 and provided to the memory controller through the memory buffer. Also, the data stored in the read data latches may be transmitted to the ECC engine 1802. The ECC engine 1802 may detect and correct an error bit included in the data read from the normal cell array by using the parity bits.

In response to the ECC control signal, the ECC engine 1802 may perform the ECC operation on the fail cell of the normal cell array. The ECC engine 1802 may adaptively perform the ECC operation according to an X8 or X4 mode of the memory device 1800.

The DLR controller 1804 may replace a column of the normal cell array, which is connected to the fail cell, with a column of the redundancy cell array, in response to the DLR control signal. The DLR controller 1804 may perform the DLR operation in units of a data line or bit line.

Again as described above, the ECC engine 1802 or the DLR controller 1804 will be respectively activated or deactivated based on a mode control bit in the reserved bits for the wordline (i.e., row) being addressed.

Figure 19:
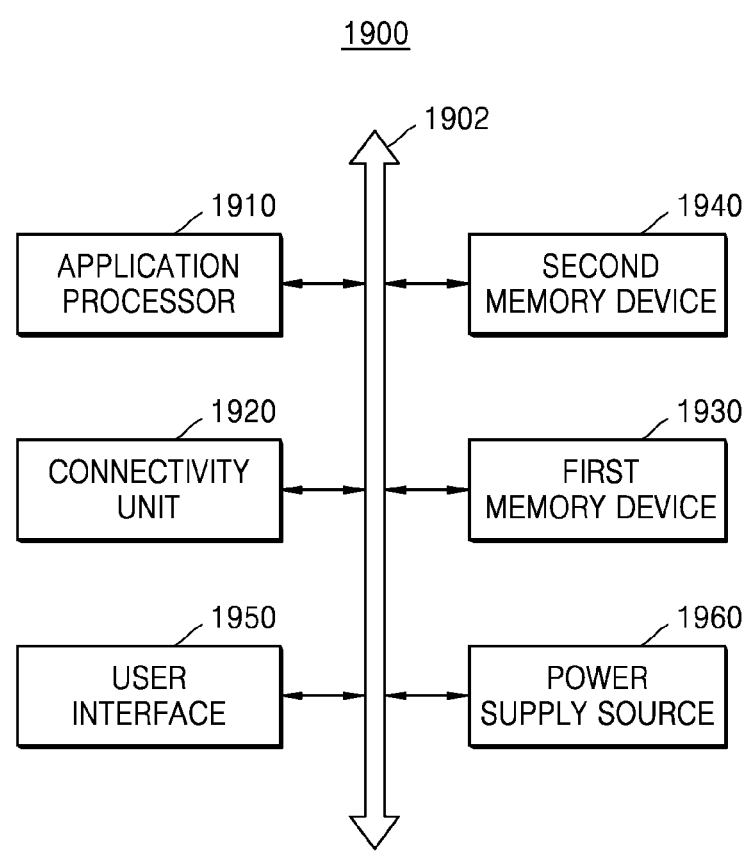
FIG. 19 is a block diagram of a mobile system to which a memory device capable of quickly repairing a fail cell is applied, according to an embodiment of the inventive concepts.

FIG. 19 is a block diagram of a mobile system 1900 to which a first memory device 1930 capable of quickly repairing a fail cell is applied, according to an embodiment of the inventive concepts.

Referring to FIG. 19, the mobile system 1900 may include an application processor 1910, a connectivity unit 1920, the first memory device 1930, a second memory device 1940, a user interface 1950, and a power supply source 1960, which are connected to each other via a bus 1902. The first memory device 1930 may be a volatile memory device, and the second memory device 1940 may be a nonvolatile memory device. According to some embodiments, the mobile system 1900 may be an arbitrary mobile system, such as a mobile phone, a smart phone, a personal digital assistant (PDA), a portable multimedia player (PMP), a digital camera, a music player, a portable game console, or a navigation system.

The application processor 1910 may execute applications that provide an Internet browser, a game, and/or a video. According to some embodiments, the application processor 1910 may include a single core or a multi-core processor. For example, the application processor 1910 may include a dual-core, a quid-core, a hexa-core processor, etc. Also, according to some embodiments, the application processor 1910 may further include an internal or external cache memory.

The connectivity unit 1920 may perform wireless communication or wired communication with an external apparatus. For example, the connectivity unit 1920 may perform Ethernet communication, near field communication (NFC), radio frequency identification (RFID) communication, mobile telecommunication, memory card communication, or universal serial bus (USB) communication. For example, the connectivity unit 1920 may include a baseband chipset, and may support communication, such as global system for mobile communication (GSM), gross rating points (GRPS), wideband code division multiple access (WCDMA), high speed packet access (HSxPA), etc.

The first memory device 1930 that is a volatile memory device may store data processed by the application processor 1910 or may operate as a working memory. The first memory device 1930 may include a memory cell array that stores fail cell information about a fail cell in some of a plurality of memory cells, and an ECC engine that performs an ECC operation on the fail cell. The memory cell array may store parity bits with respect to the fail cell in some of the other memory cells. The first memory device 1930 may include a storage unit that stores the fail cell information about the fail cell generated in the memory cell array, wherein the storage unit may store the fail cell information in some of the memory cells during initialization of the first memory device 1930. The first memory device 1930 may include a comparator that outputs a control signal based on a result of comparing the fail cell information read from the some of the memory cells with an access address received from an external source outside the first memory device 1930, and the ECC engine may perform the ECC operation in response to the control signal.

The first memory device 1930 may include the memory cell array that stores the fail cell information in the some of the memory cells, and a redundancy control circuit that performs a DLR operation to repair the fail cell. The first memory device 1930 may include the storage unit that stores the fail cell information about the fail cell generated in the memory cell array, wherein the storage unit stores the fail cell information in the some of the memory cells during the initialization of the first memory device 1930. The first memory device 1930 may include the comparator that outputs a control signal based on a result of comparing the fail cell information read from the some of the memory cells with the access address received from the external source outside the first memory device 1930, and the redundancy control circuit may perform the DLR operation in response to the control signal.

The second memory device 1940 that is a nonvolatile memory device may store a boot image for booting the mobile system 1900. For example, the second memory device 1940 may be electrically erasable programmable read-only memory (EEPROM), a flash memory, phase change random access memory (PRAM), resistance random access memory (RRAM), nano-floating gate memory (NFGM), polymer random access memory (PoRAM), magnetic random access memory (MRAM), ferroelectric random access memory (FRAM), a memory similar thereto, etc.

The user interface 1950 may include at least one input device, such as a keypad or a touch screen, and/or at least one output device, such as a speaker a display device, etc. The power supply source 1960 may supply an operation voltage. Also, according to some embodiments, the mobile system 1900 may further include a camera image processor (CIP), and may further include a storage device, such as a memory card, a solid state drive (SSD), a hard disk drive (HDD), a CD-ROM, etc.

Figure 20:
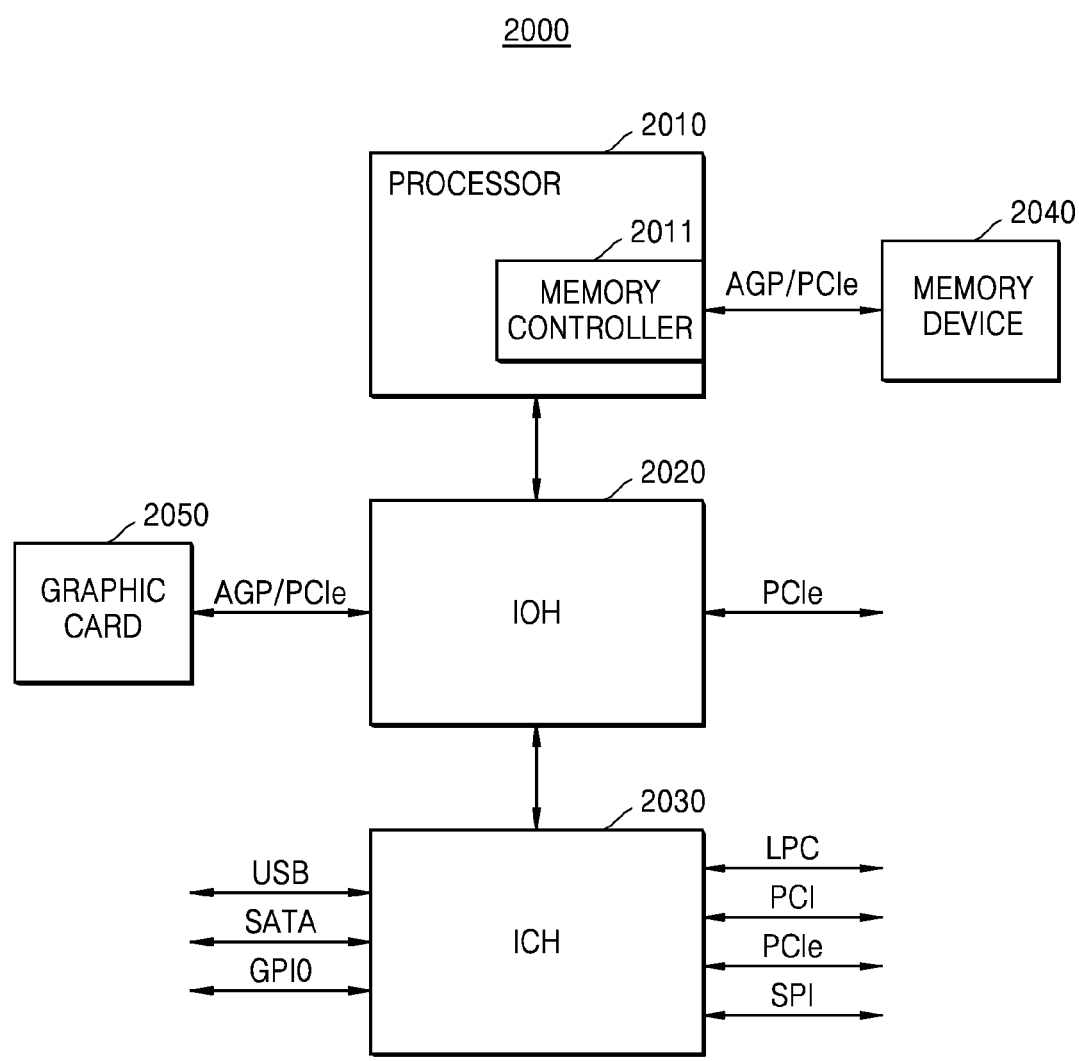
FIG. 20 is a block diagram of a computing system to which a memory device capable of quickly repairing a fail cell is applied, according to an embodiment of the inventive concepts.

FIG. 20 is a block diagram of a computing system 2000 to which a memory device 2040 capable of quickly repairing a fail cell is applied, according to an embodiment of the inventive concepts.

Referring to FIG. 20, the computing system 2000 includes a processor 2010, an I/O hub (IOH) 2020, an I/O controller hub (ICH) 2030, the memory device 2040, and a graphics card 2050. According to some embodiments, the computing system 2000 may be an arbitrary computing system, such as a personal computer (PC), a server computer, a workstation, a laptop, a mobile phone, a smart phone, a PDA, a PMP, a digital camera, a digital television (DTV), a set-top box, a music player, a portable game console, or a navigation system.

The processor 2010 may execute various computing functions, such as certain calculations or tasks. For example, the processor 2010 may be a microprocessor or a CPU. According to some embodiments, the processor 2010 may include a single core or a multi-core processor. For example, the processor 2010 may include a dual-core, a quad-core, or a hexa-core processor. Also, in FIG. 20, the computing system 2000 includes one processor 2010, but according to embodiments, the computing system 2000 may include a plurality of the processors 2010. Also, according to some embodiments, the processor 2010 may further include an internal or external cache memory.

The processor 2010 may include a memory controller 2011 that controls operations of the memory device 2040. The memory controller 2011 included in the processor 2010 may be referred to as an integrated memory controller (IMC). According to some embodiments, the memory controller 2011 may be disposed inside the IOH 2020. The IOH 2020, including the memory controller 2011, may be referred to as a memory controller hub (MCH).

The memory device 2040 may include a memory cell array that stores fail cell information about a fail cell in some of a plurality of memory cells, and an ECC engine that performs an ECC operation on the fail cell. The memory cell array may store parity bits with respect to the fail cell in some of the other memory cells. The memory device 2040 may include a storage unit that stores the fail cell information about the fail cell generated in the memory cell array, wherein the storage unit may store the fail cell information in some of the memory cells during initialization of the memory device 2040. The memory device 2040 may include a comparator that outputs a control signal based on a result of comparing the fail cell information read from the some of the memory cells with an access address received from an external source outside the memory device 2040, and the ECC engine may perform the ECC operation in response to the control signal.

The memory device 2040 may include the memory cell array that stores the fail cell information in the some of the plurality of memory cells, and a redundancy control circuit that performs a DLR operation to repair the fail cell. The memory device 2040 may include the storage unit that stores the fail cell information about the fail cell generated in the memory cell array, wherein the storage unit stores the fail cell information in the some of the memory cells during the initialization of the memory device 2040. The memory device 2040 may include the comparator that outputs a control signal based on a result of comparing the fail cell information read from the some of the memory cells with the access address received from the external source outside the memory device 2040, and the redundancy control circuit may perform the DLR operation in response to the control signal.

The memory device 2040 may output an error signal to notify the computing system 2000 about an error generated while the computing system 2000 is being used. Then, the computing system 2000 may replace the memory device 2040 if the memory device 2040 is determined to be unsuitable based on the error signal and a number of times the ECC operation is performed. As such, the computing system 2000 may replace the memory device 2040 before a system malfunction is caused by the memory device 2040, and thus stable system operation may be guaranteed.

The IOH 2020 may manage data transmission between apparatuses, such as the graphics card 2050, and the processor 2010. The IOH 2020 may be connected to the processor 2010 via any type of interface. For example, the IOH 2020 and the processor 2010 may be connected to each other via an interface according to any of various standards, such as a front side bus (FSB), a system bus, a HyperTransport, a lighting data transport (LDT), a quick pth interconnect (QPI), a common system interface, and peripheral component interface-express (CSI). In FIG. 20, the computing system 2000 includes one IOH 2020, but according to some embodiments, the computing system 2000 may include a plurality of the IOHs 2020.

The IOH 2020 may provide various interfaces with apparatuses. For example, the IOH 2020 may provide an accelerated graphics port (AGP) interface, a peripheral component interface-express (PCIe) interface, a communication streaming architecture (CSA) interface, etc.

The graphics card 2050 may be connected to the IOH 2020 through AGP or PCIe. The graphics card 2050 may control a display device (not shown) for displaying an image. The graphics card 2050 may include an internal processor and an internal semiconductor memory device for processing image data. According to some embodiments, the IOH 2020 may include a graphics device therein together with or instead of the graphics card 2050 disposed outside the IOH 2020. The graphics device included in the IOH 2020 may be referred to as integrated graphics. Also, the IOH 2020, including a memory controller and a graphics device, may be referred to as a graphics and memory controller hub (GMCH).

The ICH 2030 may perform data buffering and interface arbitration such that various system interfaces efficiently operate. The ICH 2030 may be connected to the IOH 2020 through an internal bus. For example, the IOH 2020 and the ICH 2030 may be connected to each other via a direct media interface (DMI), a hub interface, an enterprise Southbridge interface (ESI), or PCIe.

The ICH 2030 may provide various interfaces with peripheral devices. For example, the ICH 2030 may provide a USB port, a serial advanced technology attachment (SATA), a general purpose I/O (GPIO), a low pin count (LPC) bus, a serial peripheral interface (SPI), PCI, PCIe, etc.

According to some embodiments, at least two of the processor 2010, the IOH 2020, and the ICH 2030 may be realized in one chipset.

While the inventive concepts has been particularly shown and described with reference to example embodiments thereof, it will be understood that various changes in form and details may be made therein without departing from the spirit and scope of the following claims.

The invention claimed is:

1. A memory device, comprising: a volatile memory array having a first region configured to store data, a second region configured to store a first portion of fail cell information in memory cells accessed by a second portion of the fail cell memory, and a third region configured to store recovery information, the fail cell information identifying failed cells in the first region, the recovery information for recovering data stored in the identified failed cells, the first portion indicating fail cell column address information of the identified fail cells, the second portion indicating row addresses of the identified fail cells; and a control logic configured to store the fail cell information, to transfer only the first portion of the fail cell information to the second region of the volatile memory array, to determine whether to perform a recovery operation based on address information in an access request and the first portion of the fail cell information stored in the second region, and the access request being a request to access the first region; and a recovery circuit configured to perform a recovery operation in response to the control logic determining to perform the recovery operation.

2. The memory device of claim 1, wherein the control logic is configured to access the fail cell column address information from the second region using a row address in the address information in the access request.

3. The memory device of claim 2, wherein the fail cell column address information further includes flag information, the flag information indicating whether the row address accesses one of the identified failed cells.

4. The memory device of claim 2, wherein the fail cell column address information further includes flag information, the flag information indicating whether the row address accesses one of the identified failed cells.

5. The memory device of claim 1, wherein the fail cell column address information further includes order information, the order information indicating which data associated with the column addresses is associated with the identified failed cells.

6. The memory device of claim 5, wherein the fail cell column address information further includes flag information, the flag information indicating whether the fail cell column address information is valid.

7. The memory device of claim 6, wherein the fail cell column address information further includes parity information, the parity information for correcting errors in the fail cell column address information.

8. The memory device of claim 6, wherein the fail cell column address information further includes recovery mode information respectively indicating which one of at least two recovery operations to perform for each of the column addresses.

9. The memory device of claim 1, wherein the fail cell column address information further includes flag information, the flag information indicating which column addresses are valid.

10. The memory device of claim 1, wherein the fail cell column address information further includes parity information, the parity information for correcting errors in the fail cell column address information.

11. The memory device of claim 10, wherein the recovery circuit is configured to error correct the column addresses based on the parity information.

12. The memory device of claim 1, wherein the fail cell column address information further includes recovery mode information respectively indicating which one of at least two recovery operations to perform for each of the column addresses.

13. The memory device of claim 1, wherein the second region is divided into a plurality of blocks, and the control logic is configured to transfer the fail cell column address information to the second region such that at least two of the plurality of blocks collectively store the fail cell column address information for one of the identified failed cells.

14. The memory device of claim 1, wherein
the first region is divided into a plurality of first blocks;
the second region is divided into a plurality of second blocks;
each of the plurality of second blocks shares a data line with a respective one of the plurality of first blocks.

15. The memory device of claim 1, wherein the access request is a write request, and the recovery circuit is configured to obtain the recovery information based on data to be written in response to the control logic determining to perform the recovery operation, and the memory device is configured to store the recovery information in the third region as part of the recovery operation.

16. The memory device of claim 15, wherein the recovery operation is an error correction operation and the recovery information includes parity bits.

17. The memory device of claim 15, wherein the recovery operation is a data replacement operation and the recovery information includes data to use as a replacement for the data in the identified failed cells.

18. The memory device of claim 1, wherein the access request is a read request, and the memory device is configured to read the recovery information in response to the control logic determining to perform the recovery operation, and the recovery circuit is configured to perform the recovery operation based on the read recovery information.

19. The memory device of claim 18, wherein the recovery operation is an error correction operation and the recovery information includes parity bits.

20. The memory device of claim 19, wherein the recovery circuit includes an error correction coding circuit configured to error correct code data output at a same time across a plurality of data lines.

21. The memory device of claim 18, wherein the recovery operation is a data replacement operation and the recovery information includes data to use as a replacement for the data in the identified failed cells.

22. The memory device of claim 1, wherein the recovery operation is an error correction operation and the recovery information includes parity bits.

23. The memory device of claim 1, wherein the recovery operation is a data replacement operation and the recovery information includes data to use as a replacement for the data in the failed cell.

24. The memory device of claim 23, wherein the recovery circuit includes a replacement circuit configured to replace a data line associated with the first region with a data line associated with the third region.

25. The memory device of claim 23, wherein the recovery circuit includes a replacement circuit configured to replace a bit line associated with the first region with a bit line associated with the third region.

26. The memory device of claim 1, wherein
the recovery circuit is configured to perform an error correction operation as the recovery operation such that the recovery information includes parity bits, and the recovery circuit is configured to perform a data replacement operation as the recovery operation such that the recovery information includes data to use as a replacement for the data in the failed cell; and
the control logic is configured to control the recovery circuit to perform one of the error correction operation and the data replacement operation as the recovery operation for each column address based on mode information associated with each of the column addresses.

27. A memory device, comprising: a volatile memory array; a control logic configured to store fail cell information including fail cell row address information and fail cell column address information, the fail cell information identifying failed cells in the volatile memory array, the fail cell row address information indicating row addresses of the identified failed cells and the fail cell column address information indicating column addresses of the identified failed cells; the control logic configured to transfer only the fail cell column address information to memory cells of the volatile memory array, the memory cells are accessed by fail cell row address information; the control logic configured to determine whether to perform a recovery operation based on address information in an access request and the fail cell column address information transferred to the volatile memory array, and the access request being a request to access the volatile memory array; and a recovery circuit configured to perform the recovery operation in response to the control logic determining to perform the recovery operation.

28. The memory device of claim 27, wherein the control logic is configured to access the fail cell column address information from the volatile memory array using a row address in the address information in the access request.

29. The memory device of claim 28, wherein the fail cell column address information further includes flag information, the flag information indicating whether the row address accesses one of the identified failed cells.

30. The memory device of claim 27, wherein the fail cell column address information further includes order information, the order information indicating which data associated with the column addresses is associated with the identified failed cells.

31. The memory device of claim 27, wherein the fail cell column address information further includes flag information, the flag information indicating whether the fail cell column address information is valid.

32. The memory device of claim 27, wherein the fail cell column address information further includes parity information, the parity information for correcting errors in the fail cell column address information.

33. The memory device of claim 27, wherein the fail cell column address information further includes recovery mode information respectively indicating which one of at least two recovery operations to perform for each of the column addresses.

34. The memory device of claim 33, wherein the recovery operation is a data replacement operation.

35. The memory device of claim 27, wherein the recovery operation is an error correction operation.

36. A method, comprising: storing fail cell information including fail cell row address information and fail cell column address information in a memory, the fail cell information identifying failed cells in a volatile memory array, the fail cell row address information indicating row addresses of the identified failed cells and the fail cell column address information indicating column addresses of the identified failed cells; transferring fail cell column address information of the fail cell information to memory cells of the volatile memory array, the memory cells are accessed by fail cell row address information; determining whether to perform a recovery operation based on address information in an access request and the fail cell column address information of the fail cell information transferred to the volatile memory array, the access request being a request to access the volatile memory array; and performing a recovery operation in response to the determining determines to perform the recovery operation.

* * * * *